United States Patent
Bai et al.

(10) Patent No.: US 10,839,897 B1
(45) Date of Patent: Nov. 17, 2020

(54) SET/RESET METHODS FOR CRYSTALLIZATION IMPROVEMENT IN PHASE CHANGE MEMORIES

(71) Applicant: SANDISK TECHNOLOGIES LLC, Addison, TX (US)

(72) Inventors: Zhaoqiang Bai, San Jose, CA (US); Mac D. Apodaca, San Jose, CA (US); Michael K. Grobis, Campbell, CA (US); Michael Nicolas Albert Tran, San Jose, CA (US); Neil Leslie Robertson, Palo Alto, CA (US); Gerardo A. Bertero, Redwood City, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/411,479

(22) Filed: May 14, 2019

(51) Int. Cl.
| | | |
|---|---|---|
| *G11C 13/00* | (2006.01) | |
| *H01L 27/24* | (2006.01) | |
| *H01L 45/00* | (2006.01) | |

(52) U.S. Cl.
CPC ........ *G11C 13/0004* (2013.01); *G11C 13/004* (2013.01); *G11C 13/0026* (2013.01); *G11C 13/0028* (2013.01); *G11C 13/0069* (2013.01); *G11C 13/0097* (2013.01); *H01L 27/2481* (2013.01); *H01L 45/06* (2013.01); *H01L 45/141* (2013.01); *G11C 2213/71* (2013.01)

(58) Field of Classification Search
CPC ............ G11C 13/0004; G11C 13/0069; G11C 13/004; G11C 13/0097; G11C 13/0028; G11C 13/0026; G11C 2213/71; H01L 45/06; H01L 27/2481; H01L 45/141
See application file for complete search history.

(56) References Cited

U.S. PATENT DOCUMENTS

| | | | | |
|---|---|---|---|---|
| 9,837,153 B1 * | 12/2017 | Rajamohanan | .......... | G11C 7/04 |
| 2009/0003034 A1 * | 1/2009 | Happ | .................... | G11C 11/005 |
| | | | | 365/148 |
| 2010/0226168 A1 * | 9/2010 | Savransky | ......... | G11C 13/0004 |
| | | | | 365/163 |

(Continued)

OTHER PUBLICATIONS

Bai, et al., "Set/Reset Methods for Crystallization Improvement in Phase Change Memories," filed Jun. 26, 2020, U.S. Appl. No. 16/912,719.

*Primary Examiner* — Jerome Leboeuf
(74) *Attorney, Agent, or Firm* — Vierra Magen Marcus LLP

(57) ABSTRACT

Systems and methods for improving the crystallization of a phase change material of a phase change memory cell are described. A two-step SET pulse may be applied to the phase change material in which a first lower SET pulse is applied to make the phase change material dwell at 600K to incubate nuclei near the maximum nucleation rate and then a second higher SET pulse is immediately applied to make the phase change material dwell at 720K to maximize crystal growth. Moreover, the slope of the falling edge of a RESET pulse applied prior to the two-step SET pulse may be adjusted to increase the number of nuclei (e.g., formed with a steeper falling edge) to increase SET efficiency at the expense of a more stable amorphous phase (e.g., formed with a less steep falling edge) that improves data retention.

19 Claims, 16 Drawing Sheets

(56) References Cited

U.S. PATENT DOCUMENTS

| | | | | |
|---|---|---|---|---|
| 2012/0106242 A1* | 5/2012 | Lee | ............... | G11C 7/04 |
| | | | | 365/163 |
| 2016/0012889 A1* | 1/2016 | Shepard | ............... | H01L 45/1683 |
| | | | | 365/163 |
| 2017/0076795 A1* | 3/2017 | Chen | ............... | G11C 13/0069 |
| 2019/0295642 A1* | 9/2019 | Pirovano | ............... | G11C 13/0004 |

* cited by examiner

SET/RESET METHODS FOR CRYSTALLIZATION IMPROVEMENT IN PHASE CHANGE MEMORIES

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations.

DETAILED DESCRIPTION

Figure 1A:
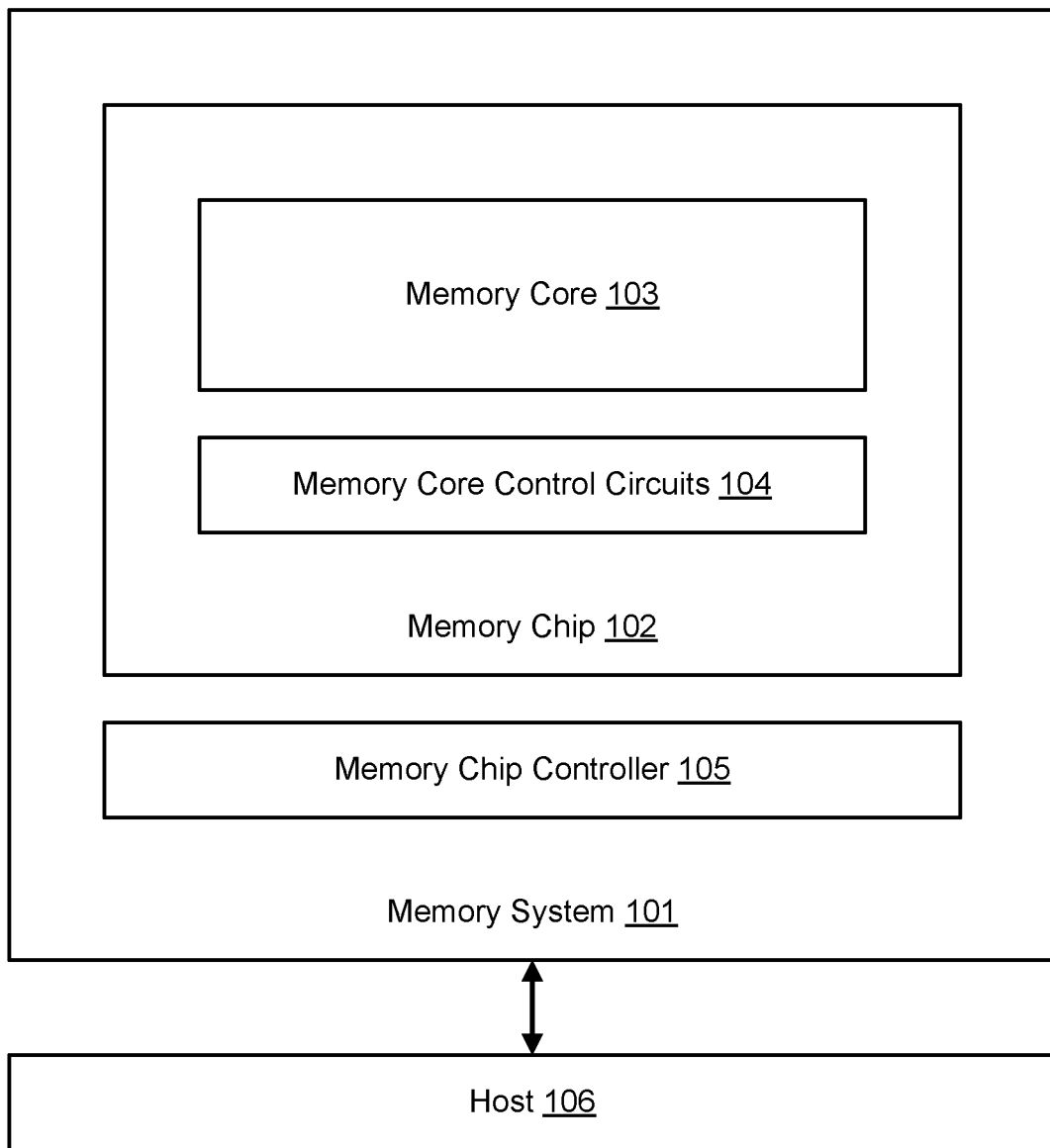
FIGS. 1A-1F depict various embodiments of a memory system.

Technology is described for improving the crystallization of a phase change material of a phase change memory cell when transitioning from a high resistance amorphous state (e.g., the RESET state) into a lower resistance crystalline state (e.g., the SET state). The phase change material may comprise a nucleation-dominated phase change material, such as a germanium-antimony-tellurium compound. As the volume of a nucleation-dominated phase change material scales with reduced process geometries (e.g., as the critical dimension of phase change memory devices scales below 80 nm), the crystallization of the phase change material may become more difficult due to the absence of nucleation sites. In some phase change materials, the nucleation rate may be maximized at a first temperature (e.g., 600K) while the crystal growth rate is maximized at a second temperature (e.g., 720K) greater than the first temperature. For these materials, a programming operation (e.g., a SET operation) may employ a programming voltage waveform in which a first lower SET pulse is applied to make the phase change material dwell at 600K to incubate nuclei near the maximum nucleation rate and then a second higher SET pulse is immediately applied to make the phase change material dwell at 720K to maximize crystal growth. The pulse width of the second higher SET pulse may be less than the pulse width of the first lower SET pulse as the crystallization time-scale may be much shorter than nucleation. One benefit of applying a two-step SET pulse that includes the first lower SET pulse and the second higher SET pulse is that the combined SET pulse width may be shortened thereby improving programming time and reducing power consumption.

Moreover, the number and size of nuclei may depend on the thermal history of amorphization for the phase change material. For example, a steeper falling edge of a prior RESET pulse applied to the phase change material to RESET the phase change material into an amorphous higher resistance state from a more crystalline lower resistance state may lead to a lesser number of nuclei and/or smaller nuclei. Thus, the falling edge of a RESET pulse may be adjusted to increase the number of nuclei (e.g., formed with a less steep falling edge) to increase SET efficiency at the expense of a more stable amorphous phase (e.g., formed with a steeper falling edge) that improves data retention. In some embodiments, the slope of the falling edge of a RESET pulse applied to the phase change material to RESET the phase change material may be set based on a data retention time for the phase change material (e.g., how long until the phase change material will be subsequently written to or erased) and/or the number of data write errors that have occurred when SETTING the phase change material into the lower resistance state. In one example, if the data retention time for the phase change material is greater than a threshold amount of time (e.g., the data must be retained for more than one hour), then the slope of the falling edge of the RESET pulse may be set to a first slope (e.g., falling 1V in 50 ns); otherwise, if the data retention time for the phase change material is less than the threshold amount of time, then the slope of the falling edge of the RESET pulse may be set to a second slope (e.g., falling 1V in 10 ns) that is steeper than the first slope. In another example, if a data write error occurred while SETTING the phase change material during a prior SET operation, then the slope of the falling edge of the RESET pulse may be set to the first slope that is less steep than the second slope in order to form a greater number of nuclei and/or larger nuclei within the phase change material; otherwise, if a data write error did not occur while SETTING the phase change material in the prior SET operation, then the slope of the falling edge of the RESET pulse may remain at the first slope that is steeper than the second slope.

In some embodiments, the determination of whether to apply a falling edge of the RESET pulse using the first slope or the second slope that is steeper than the first slope may depend on the number of SET/RESET cycles for a phase change material of a phase change memory cell. The number of SET/RESET cycles for the phase change material may comprise the number of times that the phase change material has experienced a RESET pulse followed by a SET pulse. The number of SET/RESET cycles for the phase change material may correspond with the number of times that the phase change material has transitioned from a high resistance amorphous state (e.g., the RESET state) into a lower resistance crystalline state (e.g., the SET state). In one example, if the number of SET/RESET cycles for the phase change material is greater than a threshold number of cycles (e.g., the phase change material has been RESET more than ten times after being SET), then the first slope that is less steep than the second slope may be used for the falling edge of the RESET pulse. As the number of SET/RESET cycles for the phase change material of the phase change memory cell increases, the data retention characteristics of the phase change material may degrade. In this case, the slope of the falling edge of the RESET pulse may be made steeper with a faster transition from the maximum RESET voltage in order to improve data retention for the phase change memory cell.

In some embodiments, the determination of whether to apply a falling edge of the RESET pulse using the first slope or the second slope that is steeper than the first slope may depend on a chip temperature. In one example, if the chip temperature is greater than a threshold temperature (e.g., the chip temperature is greater than 55 degrees Celsius), then the second slope that is steeper than the first slope may be used for the falling edge of the RESET pulse.

A phase change material in a phase change memory cell may be arranged in series with a heating element (or a heater) to locally heat portions of the phase change material and cause the phase change material to transition between a higher-resistance amorphous state and a lower-resistance crystalline state. The phase change material may comprise a chalcogenide-based memory material such as a germanium-antimony-tellurium compound (GST), a chalcogenide glass, or a chalcogenide alloy such as $Ge_{10}Se_{54}As_{36}$ or $Ge_{17}Te_{50}As_{33}$. A chalcogenide-based material, such as $Ge_{10}Se_{54}As_{36}$ or $Ge_{17}Te_{50}As_{33}$, may experience a first-fire effect such that once a first-fire voltage is applied across the chalcogenide-based material for the first time, the current/voltage characteristics for the chalcogenide-based material may be permanently changed. For example, the chalcogenide-based material may exhibit different currents in response to the same voltage applied to the chalcogenide-based memory cell depending on whether the chalcogenide-based material has experienced the first-fire effect. The first-fire voltage may be a function of the thickness of the chalcogenide-based material and may comprise the voltage necessary to switch the chalcogenide-based material for the first time after fabrication from a high-resistance state (or a non-conducting state) to a lower-resistance state (or a conducting state). The first-fire voltage may be applied to the chalcogenide-based material during a forming operation for a chalcogenide-based memory cell.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a selector element or an isolation element, such as a diode or threshold switch, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more control circuits may include or be in communication with voltage waveform generation circuitry for generating programming pulses. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
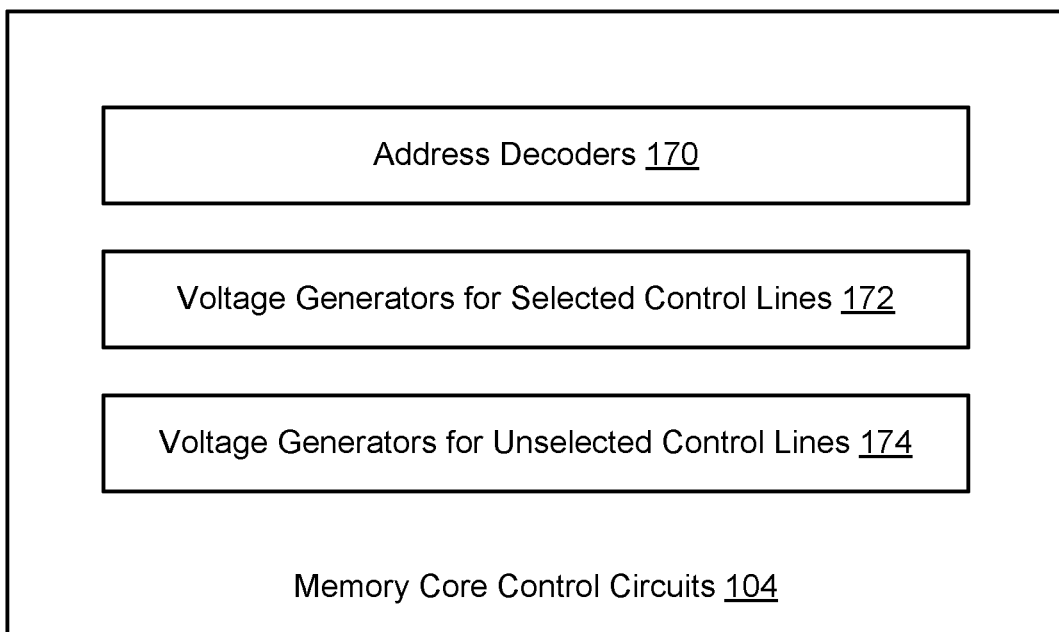

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
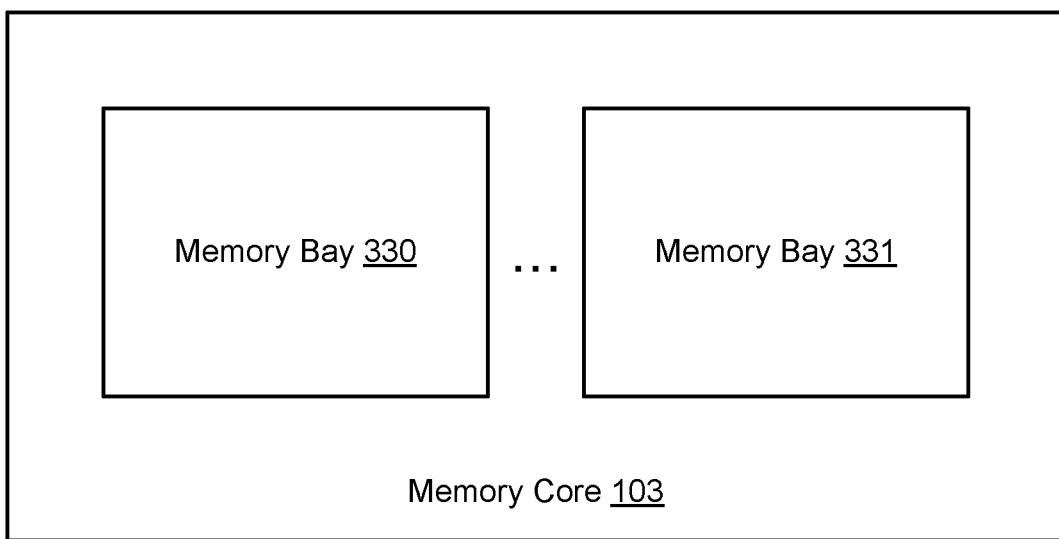

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
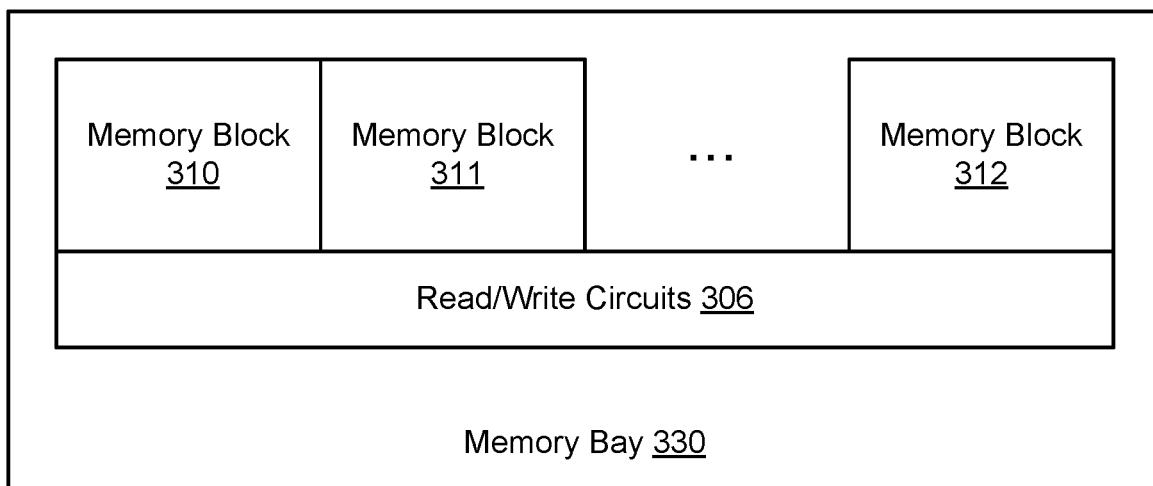

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
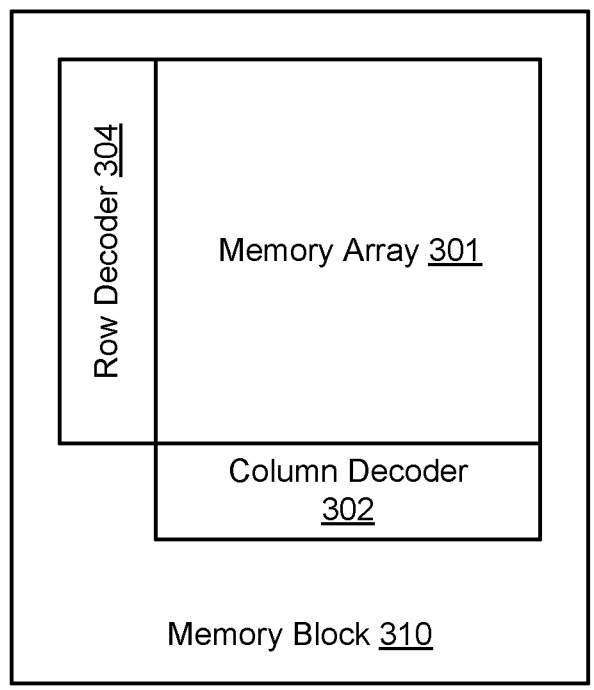

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
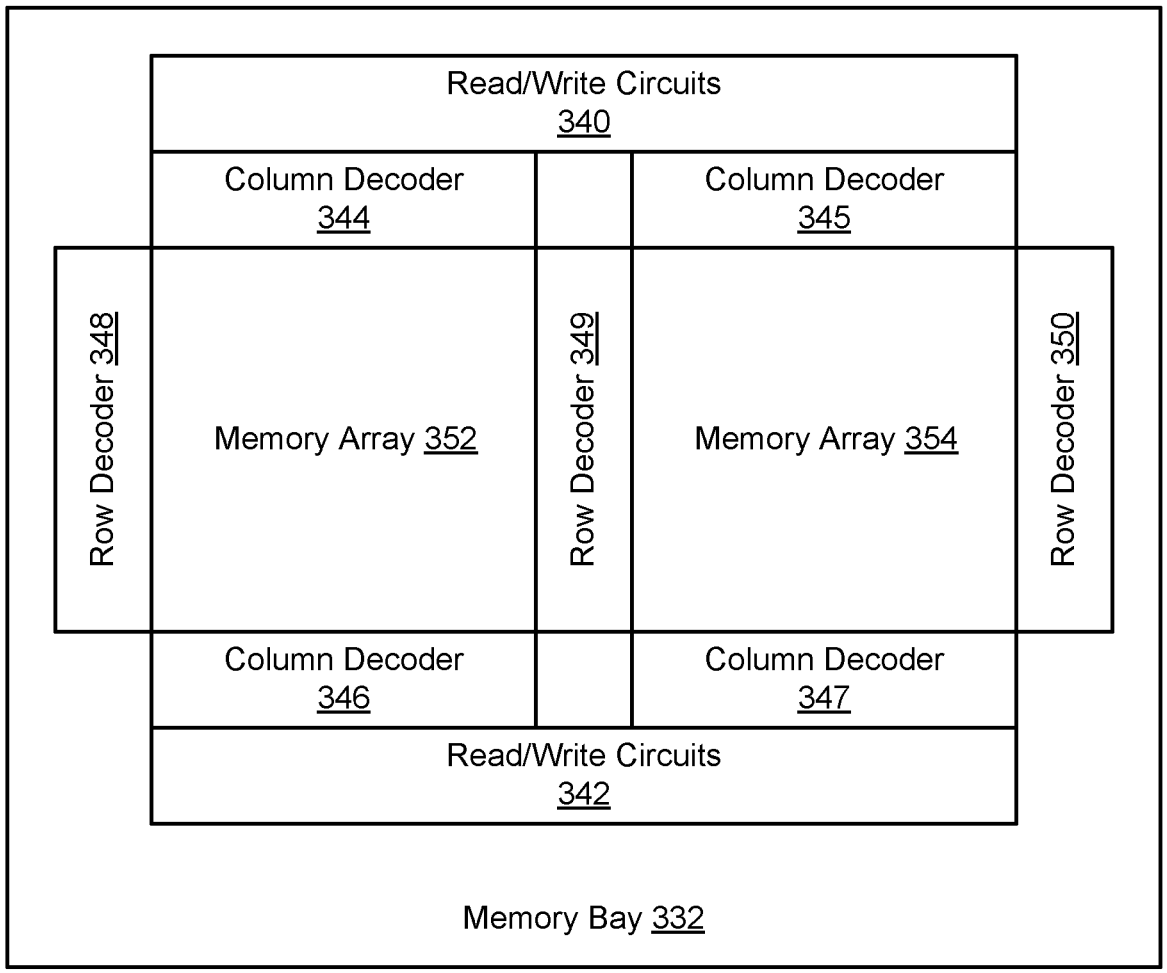

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
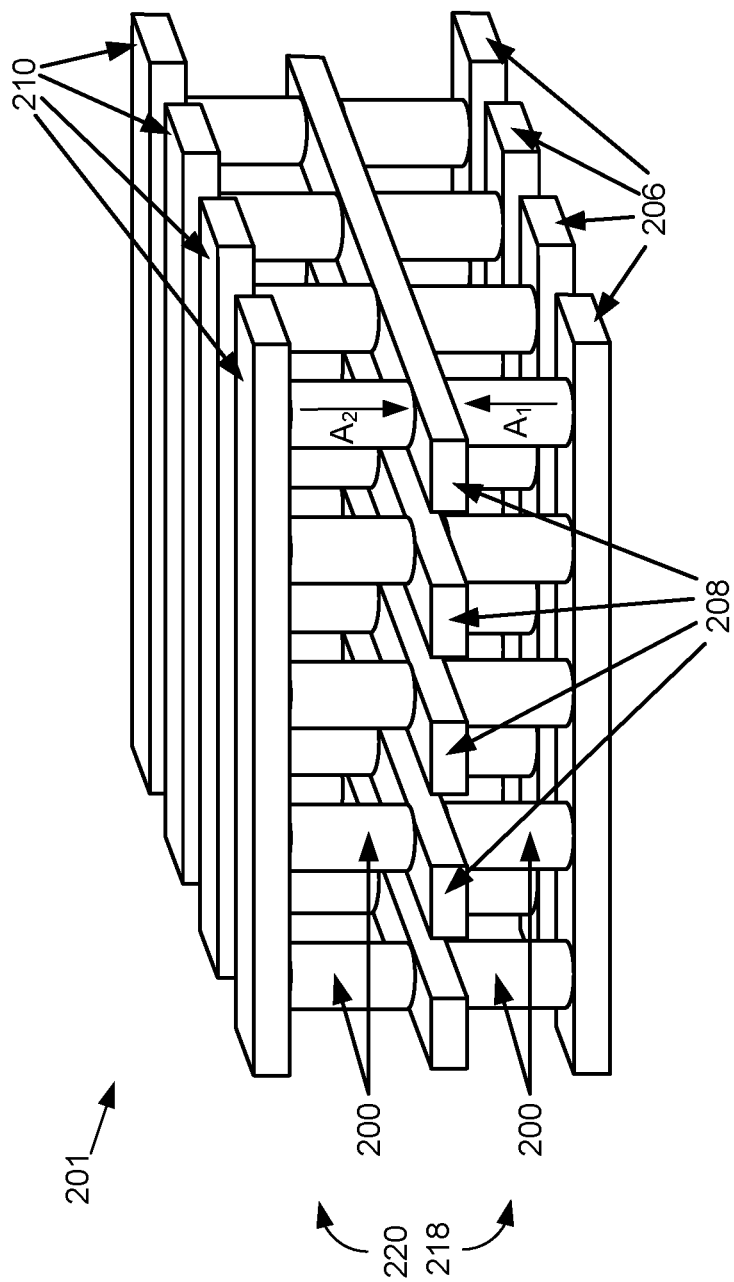
FIGS. 2-3 depict various embodiments of a portion of a three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include amorphous write-once memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a selector element (e.g., a diode or threshold switch) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another example, the selector element may comprise a chalcogenide threshold switch composed primarily of elements picked from Ge, Se, As, Te, Sb, Si, C, O, and N. In another embodiment, each memory cell includes a state change element and does not include a selector element. The absence of a diode (or other selector element) from a memory cell may reduce the process complexity and costs associated with manufacturing a memory array.

Referring to FIG. 2, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line.

Referring to FIG. 2, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

In one embodiment, a chalcogenide-based material may be in an initial high-resistivity state that is one-time switchable to a low-resistivity state upon application of a first-fire voltage across the chalcogenide-based material. The high resistance state may represent a binary data "0" while the low resistance state may represent a binary data "1."

Figure 3:
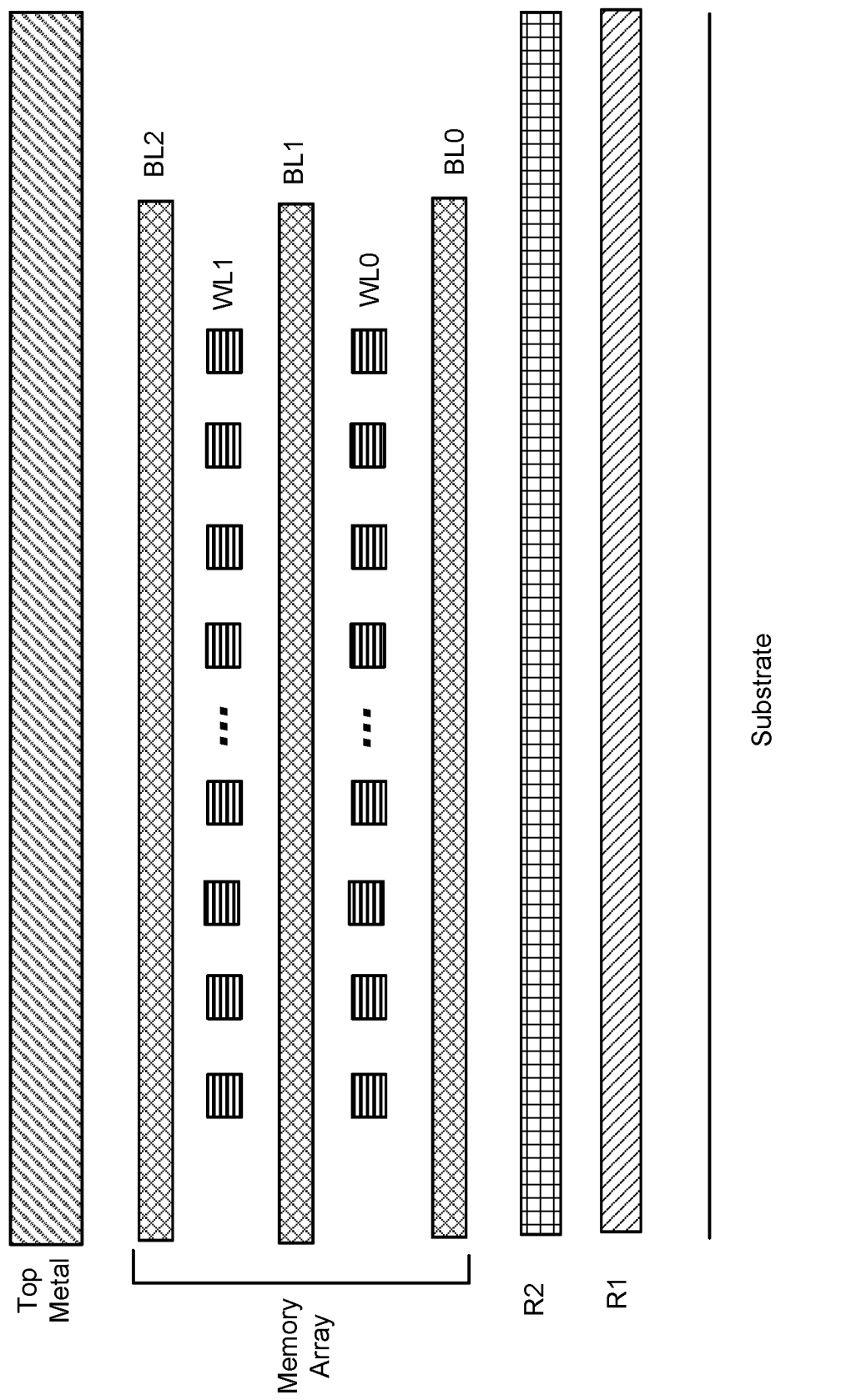

FIG. 3 depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4A:
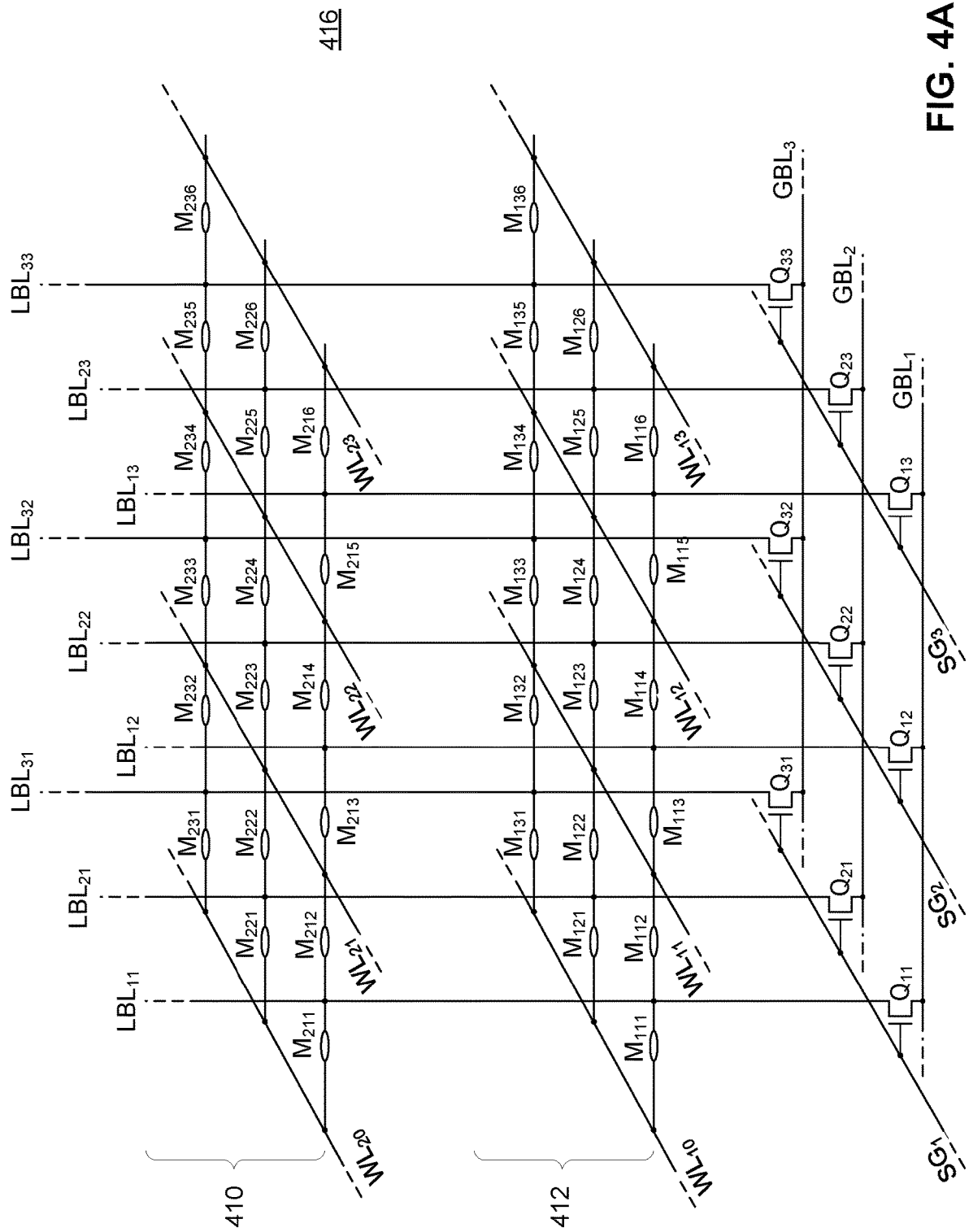
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a metal oxide, a chalcogenide-based material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 4B:
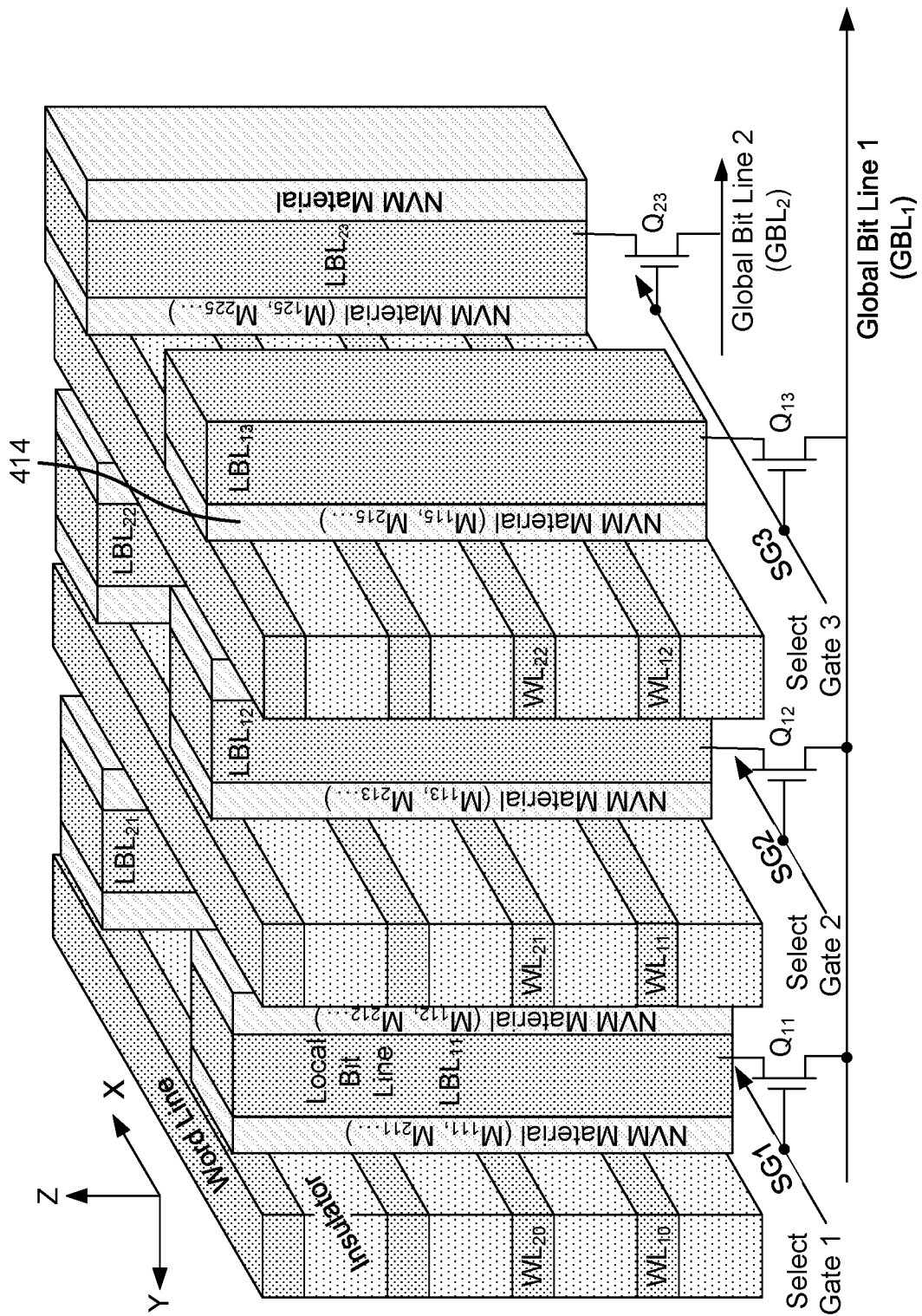

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., titanium oxide, nickel oxide or hafnium oxide), a vertical layer of phase change material (e.g., a chalcogenide material), or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of chalcogenide-based material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
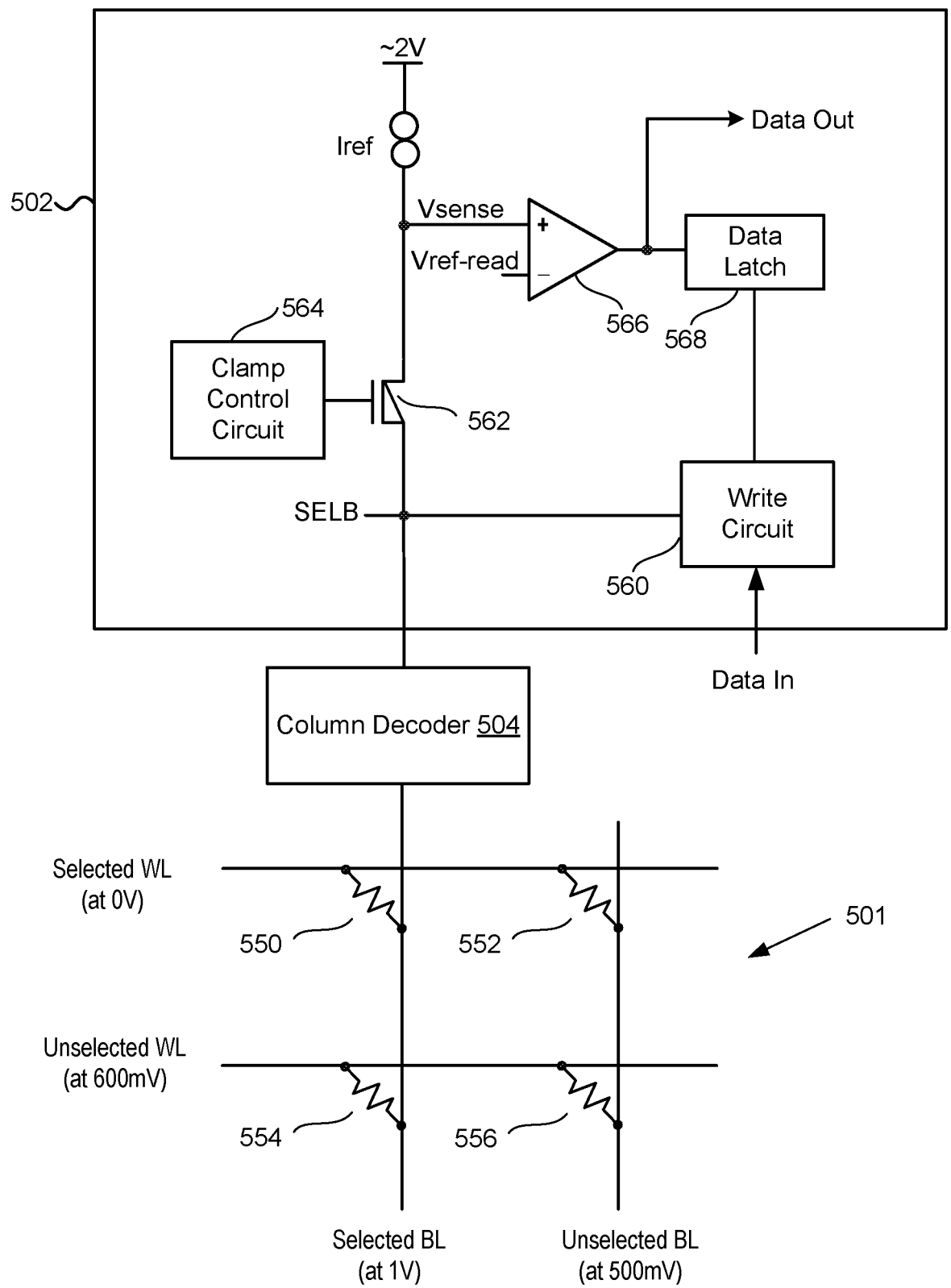
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2. In another embodiment, the portion of a memory array 501 may comprise a memory array with bit lines arranged in a vertical direction that is perpendicular to the substrate, such as memory array 416 in FIG. 4A.

In some cases, the memory chip controller 105 in FIG. 1A or the memory core control circuits 104 in FIG. 1A may comprise representative examples of means for receiving a set of data to be stored using a chalcogenide-based memory or means for writing or programming a set of data to a chalcogenide-based memory. In some cases, the memory core control circuits 104 in FIG. 1A and/or the read/write circuit 502 in FIG. 5 may comprise representative examples of means for writing or programming a chalcogenide-based memory array. The memory array 501 may include a plurality of chalcogenide-based memory cells. Each of the memory cells within the memory array 501 may include a chalcogenide-based material. In one embodiment, the chalcogenide-based material may comprise a germanium-antimony-tellurium compound.

As depicted, during a memory array programming operation (e.g., a programming operation such as a SET or RESET operation), the selected bit line may be biased to 4.0V, the unselected word line may be biased to 2.0V, the selected word line may be biased to 0V, and the unselected bit line may be biased to 2.0V. In some embodiments, during a second memory array operation, the selected bit line may be biased to a second selected bit line voltage (e.g., 6.0V), the unselected word line may be biased to a second unselected word line voltage (e.g., 3.0V), the selected word line may be biased to a second selected word line voltage (e.g., 0V), and the unselected bit line may be biased to a second unselected bit line voltage (e.g., 3.0V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 2.0V, the selected word line is biased to 4.0V, and the unselected bit line is biased to 2.0V. In another embodiment, the bit line is biased to maintain a constant current through the word line or bit line, as sensed by the drive or sense circuitry.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568. In one embodiment, the write circuit 560 may include one or more voltage waveform generators for generating voltage waveforms to drive bit lines and/or word lines during a programming or erase operation.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
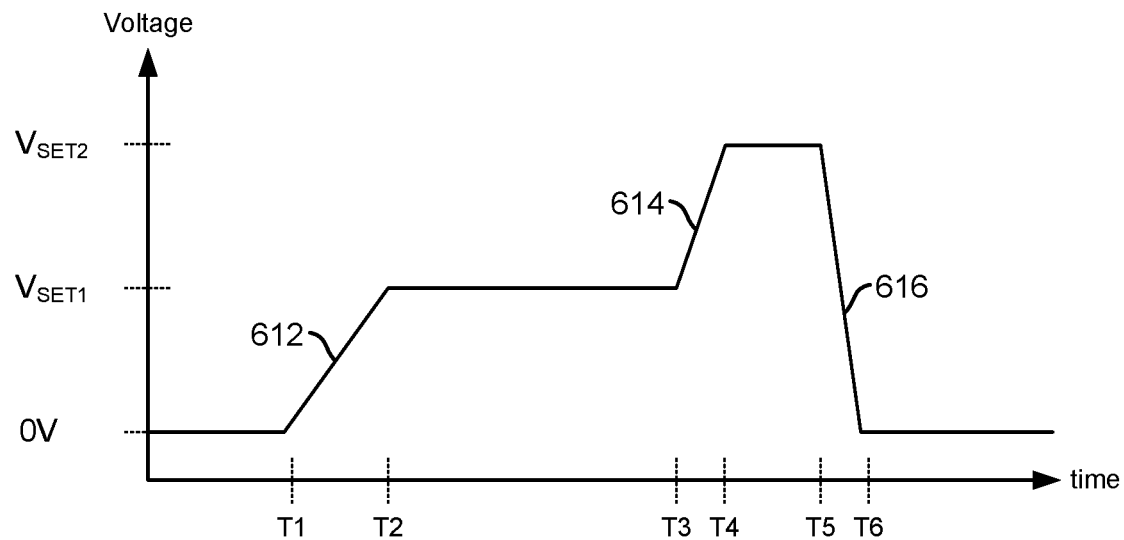
FIGS. 6A-6C depict various embodiments of a two-step SET pulse.

FIG. 6A depicts one embodiment of a two-step SET pulse that includes a first ramp up to a first voltage level for a first portion of the two-step SET pulse and a second ramp up to a second voltage level greater than the first voltage level for a second portion of the two-step SET pulse. As depicted, the two-step SET pulse ramps up from 0V at time Ti to a first voltage level VSET1 at time T2 and then ramps up from the first voltage level VSET1 at time T3 to a second voltage level VSET2 at time T4. The two-step SET pulse ramps down from the second voltage level VSET2 at time T5 to 0V at time T6. The first slope 612 of the two-step SET pulse between times T1 and T2 may be less steep than the second slope 614 of the two-step SET pulse between times T3 and T4; in this case, the second slope 614 is steeper than the first slope 612. In some cases, the ramp down slope 616 between times T5 and T6 may be steeper than either the first slope 612 or the second slope 614. The first pulse width during which the two-step SET pulse is held at the first voltage level VSET1 (e.g., between times T2 and T3) may be greater than the second pulse width during which the two-step SET pulse is held at the second voltage level VSET2 (e.g., between times T4 and T5). In this case, the second pulse width may be less than the first pulse width as the crystal growth time-scale for a phase change material may be much shorter than nucleation. In some cases, the voltage ramps for the two-step SET pulse may be generated using a voltage waveform generator that adjusts resistance and capacitance values in order to adjust the ramp rates for the slopes 612 and 614. The two-step SET pulse voltage levels VSET1 and VSET2 may be generated using a voltage generation circuit that inputs a reference voltage (e.g., 1.25V outputted from a bandgap voltage reference) and outputs the desired voltage level based on resistor ladder configuration settings.

Figure 6B:
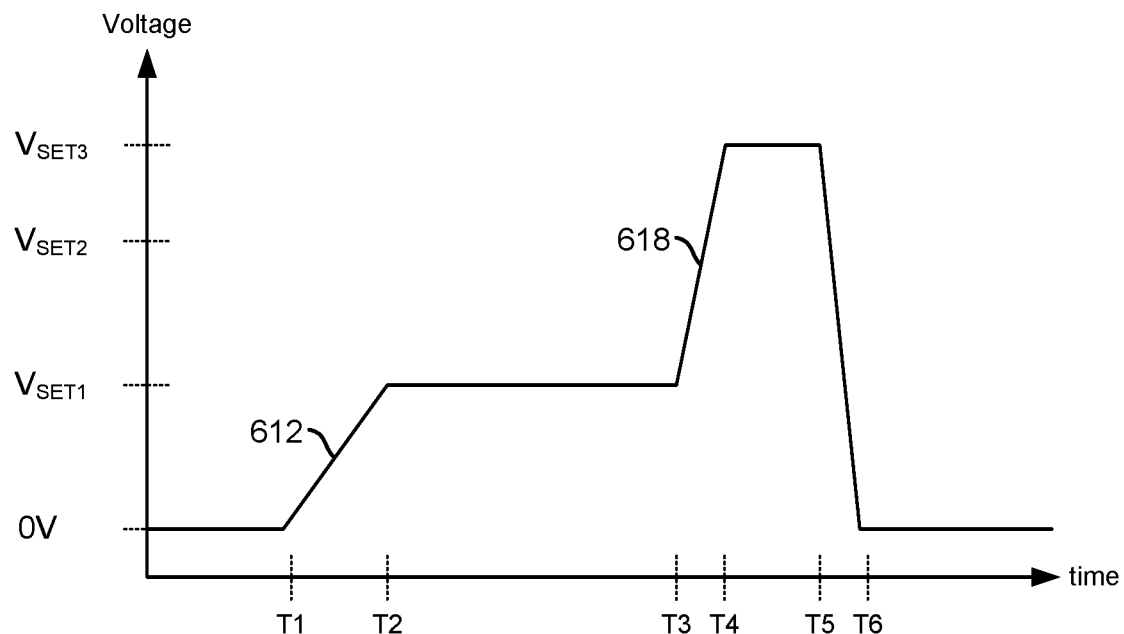

FIG. 6B depicts one embodiment of a two-step SET pulse in which the second portion of the two-step SET pulse comprises a ramp up from the first voltage level VSET1 at time T3 to a third voltage level VSET3 greater than the second voltage level VSET2 in FIG. 6A. In this case, the voltage level for the second portion of the two-step SET pulse may be increased based on a chip temperature or in response to a failure to SET a phase change material during a previously applied two-step SET pulse. In one example, if the chip temperature is greater than a threshold temperature, then the voltage level for the second portion of the two-step SET pulse may be increased from the second voltage level VSET2 to the third voltage level VSET3. As depicted, the slope 618 up to the third voltage level VSET3 may be steeper than the slope 614 up to the second voltage level VSET2. The chip temperature may be determined using a temperature sensor (e.g., a bandgap-based temperature sensor).

In one embodiment, the two-step SET pulse of FIG. 6A may be applied to a phase change memory cell as the first two-step SET pulse out of a plurality of two-step SET pulses that are applied to the phase change memory cell. The second two-step SET pulse out of the plurality of two-step SET pulses may comprise the two-step SET pulse of FIG. 6B. For each successive two-step SET pulse of the plurality of two-step SET pulses, the voltage level for the second portion of the two-step SET pulse associated with making the phase change material dwell at a temperature for maximizing crystal growth may be increased (e.g., from a maximum voltage level of VSET2 for the first two-step SET pulse to a maximum voltage level of VSET3 for the second two-step SET pulse).

Figure 6C:
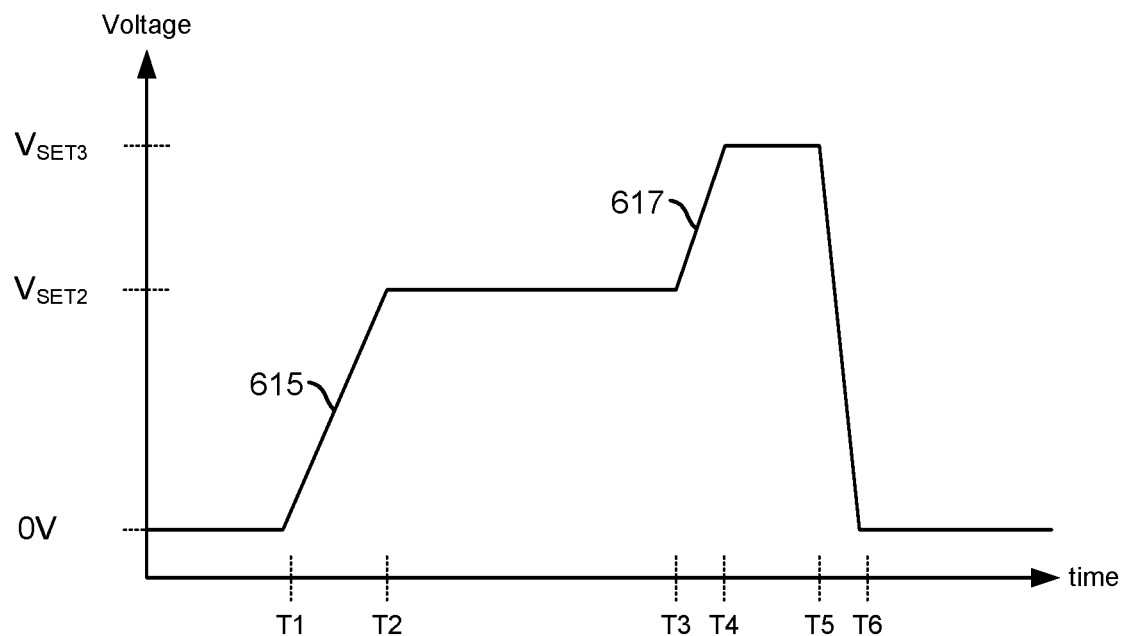

FIG. 6C depicts one embodiment of a two-step SET pulse in which the first portion of the two-step SET pulse comprises a ramp up from 0V at time T1 to the second voltage level VSET2 greater than the first voltage level VSET1 in FIG. 6B at time T2. The first slope 615 between times T1 and T2 may be less steep than the second slope 617 between times T3 and T4. The determination to increase the voltage level for the first portion of the two-step SET pulse may be made in response to detecting that the chip temperature is greater than a threshold temperature (e.g., is greater than 65 degrees Celsius). The voltage level VSET2 may be generated using a first voltage generation circuit that inputs a reference voltage (e.g., 1.25V) and the voltage level VSET3 may be generated using a second voltage generation circuit that also inputs the reference voltage. In some embodiments, the reference voltage inputted to a voltage generation circuit may be adjusted in order to change the outputted voltage level from the voltage generation circuit. In this case, the voltage level VSET2 may be generated by a voltage generation circuit using a first inputted reference voltage (e.g., 1V) and the voltage level VSET3 may be generated by the same voltage generation circuit using a second inputted reference voltage (e.g., 1.3V).

Figure 6D:
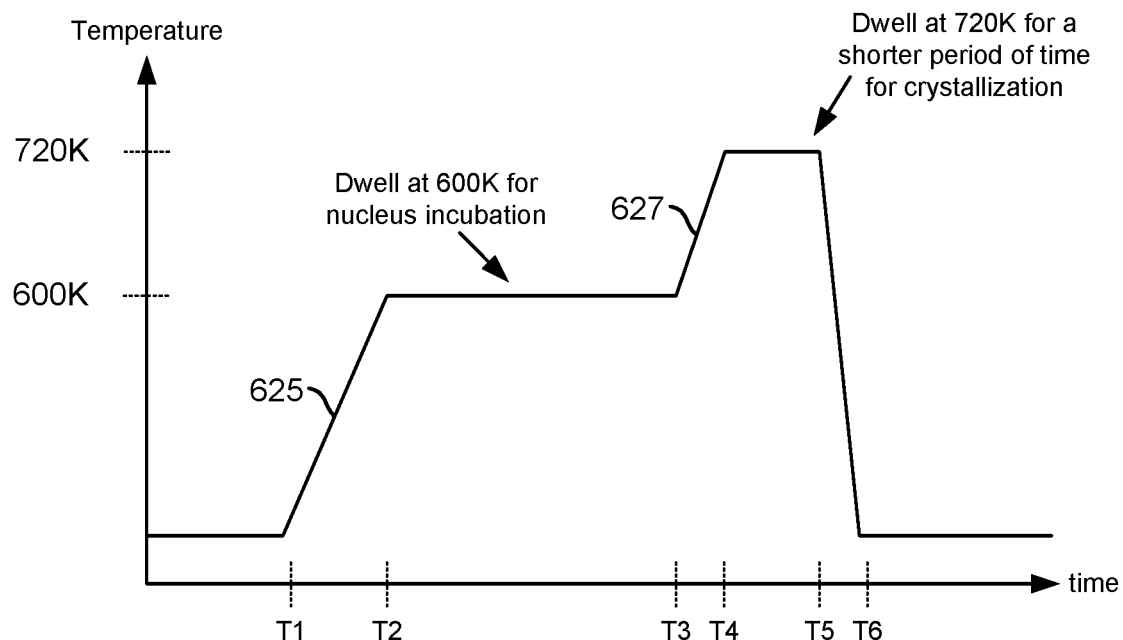
FIG. 6D depicts one embodiment of a temperature profile that corresponds with the two-step SET pulse of FIG. 6C applied to a phase change material of a phase change memory cell.

FIG. 6D depicts one embodiment of a temperature profile that corresponds with the two-step SET pulse of FIG. 6C applied to a phase change material of a phase change memory cell. As depicted, the first slope 615 in FIG. 6C corresponds with the change in temperature 625 between times T1 and T2. The first portion of the two-step SET pulse causes the phase change material to dwell at or be held at 600K to maximize nucleus incubation. The second slope 617 in FIG. 6C corresponds with the change in temperature 627 between times T3 and T4. The second portion of the two-step SET pulse may be set to cause the phase change material to dwell at or be held at 720K to maximize crystallization of the phase change material.

In some embodiments, the pulse width corresponding with the first portion of the two-step SET pulse may be set based on the falling edge of a prior RESET pulse for resetting the phase change material. In one example, if the slope of the falling edge of the prior RESET pulse is greater than a threshold slope, then the pulse width corresponding with the first portion of the two-step SET pulse may be increased from 50 ns to 100 ns. Otherwise, if the slope of the falling edge of the prior RESET pulse is not greater than the threshold slope, then the pulse width corresponding with the first portion of the two-step SET pulse may be set to 50 ns or reduced from 100 ns to 50 ns. As a steeper falling slope for the prior RESET pulse may lead to a more stable amorphous phase at the expense of increased hardship for the following SET operation, the pulse width for the first portion of the two-step SET pulse may be increased to allow more time for nuclei to be incubated.

Figure 6E:
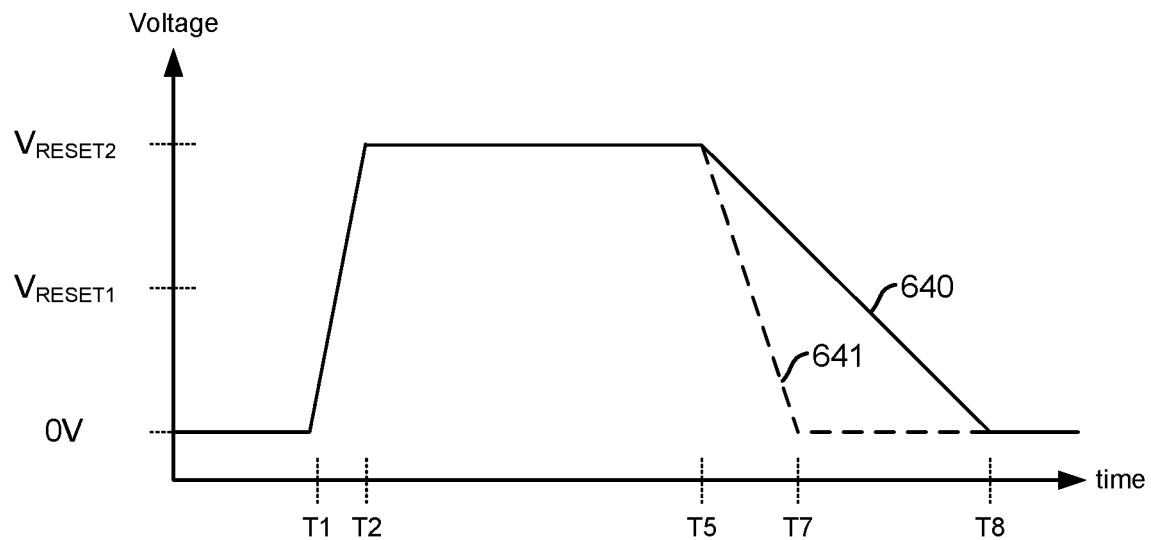
FIG. 6E depicts one embodiment of a RESET pulse for resetting a phase change material of a phase change memory cell.

FIG. 6E depicts one embodiment of a RESET pulse for resetting a phase change material of a phase change memory cell. The RESET pulse may cause the phase change material to be placed into a high resistance amorphous state. As depicted, the first slope 641 of the falling edge of the RESET pulse may be steeper than the second slope 640 of the falling edge of the RESET pulse. The slope of the falling edge of the RESET pulse may be set based on a data retention time for the phase change material (e.g., how long until the phase change material will be subsequently written to or erased) and/or the number of data write errors that have occurred when SETTING the phase change material into a lower resistance state during previous SET operations. In one example, if the data retention time for the phase change material is greater than a threshold amount of time (e.g., more than one hour), then the slope of the falling edge of the RESET pulse may be set to the second slope 640; otherwise, if the data retention time for the phase change material is less than the threshold amount of time, then the slope of the falling edge of the RESET pulse may be set to a first slope 641 that is steeper than the second slope 640. In another example, if a prior data write error occurred while SETTING the phase change material, then the slope of the falling edge of the RESET pulse may be set to the second slope 640; otherwise, if a prior data write error has not occurred while SETTING the phase change material, then the slope of the falling edge of the RESET pulse may be set to the first slope 641 that is steeper than the second slope 640 in order to improve data retention for the phase change material.

In some cases, the falling edge slopes 640 and 641 may be generated using a voltage waveform generator that adjusts resistance and/or capacitance values in order to adjust the ramp rates for the slopes 640 and 641. In one example, the first slope 641 may correspond with a first RC time constant and the second slope 640 may correspond with a second RC time constant that is greater than the first RC time constant. In another example, the first slope 641 may correspond with a first capacitive load value and the second slope 640 may correspond with a second capacitive load value that is greater than the first capacitive load value. In another example, the first slope 641 may correspond with a first resistive load value and the second slope 640 may correspond with a second resistive load value that is greater than the first resistive load value.

Figure 6F:
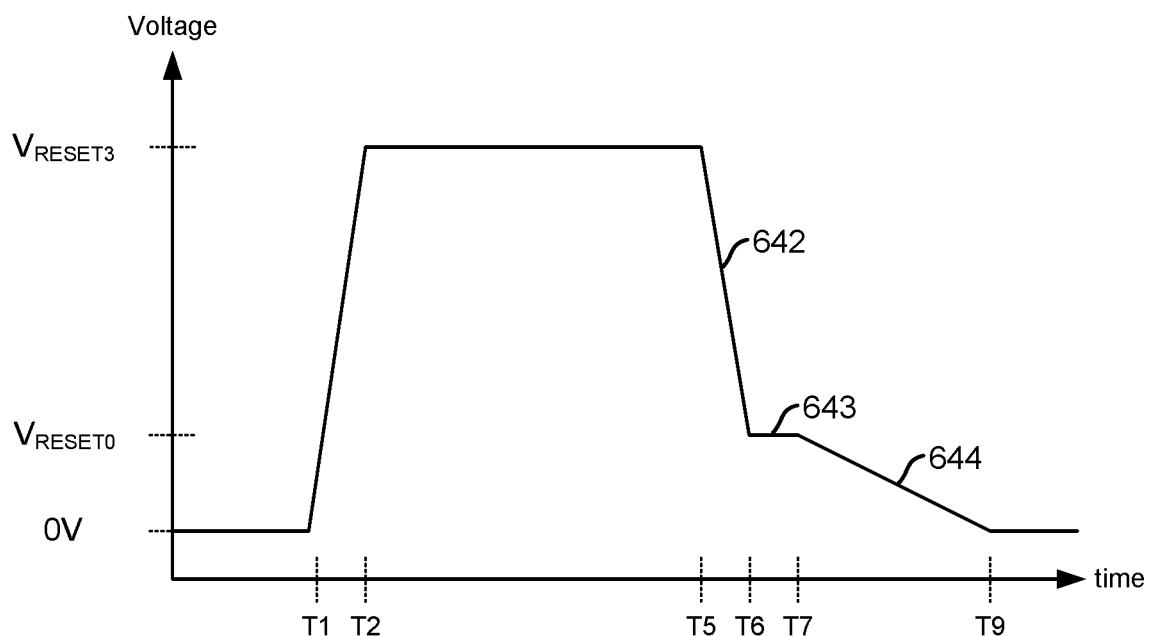
FIGS. 6F-6H depict various embodiments of a two-step RESET pulse.

FIG. 6F depicts one embodiment of a two-step RESET pulse in which a first portion of the two-step RESET pulse ramps down from a third voltage level VRESET3 at time T5 to a voltage level VRESET0 at time T6 and a second portion of the two-step RESET pulse ramps down from the voltage level VRESET0 at time T7 to 0V at time T9. The second portion of the two-step RESET pulse remains at VRESET0 between times T6 and T7. As depicted, a first slope 642 corresponding with the falling edge of the two-step RESET pulse between times T5 and T6 is steeper than the second slope 644 between times T7 and T8. The slopes 642 and 644 of the falling edges of the two-step RESET pulse may be adjusted over time to change the falling edge profile for the two-step RESET pulse. The pulse width 643 for the second portion of the two-step RESET pulse between times T6 and T7 may be adjusted over time based on chip temperature.

In some cases, the slope 642 for the falling edge of the two-step RESET pulse from the third voltage level VRESET3 at time T5 to the voltage level VRESET0 at time T6 may be generated using a first voltage waveform generator and the slope 644 for the falling edge of the two-step RESET pulse from the voltage level VRESET0 at time T7 to 0V at time T8 may be generated using a second voltage waveform generator different from the first voltage waveform generator. The circuitry for generating the two-step RESET pulse, such as the write circuit 560 in FIG. 5, may use a multiplexor to select either the voltage waveform generated by the first voltage waveform generator during the first portion of the two-step RESET pulse or the voltage waveform generated by the second voltage waveform generator during the second portion of the two-step RESET pulse.

Figure 6G:
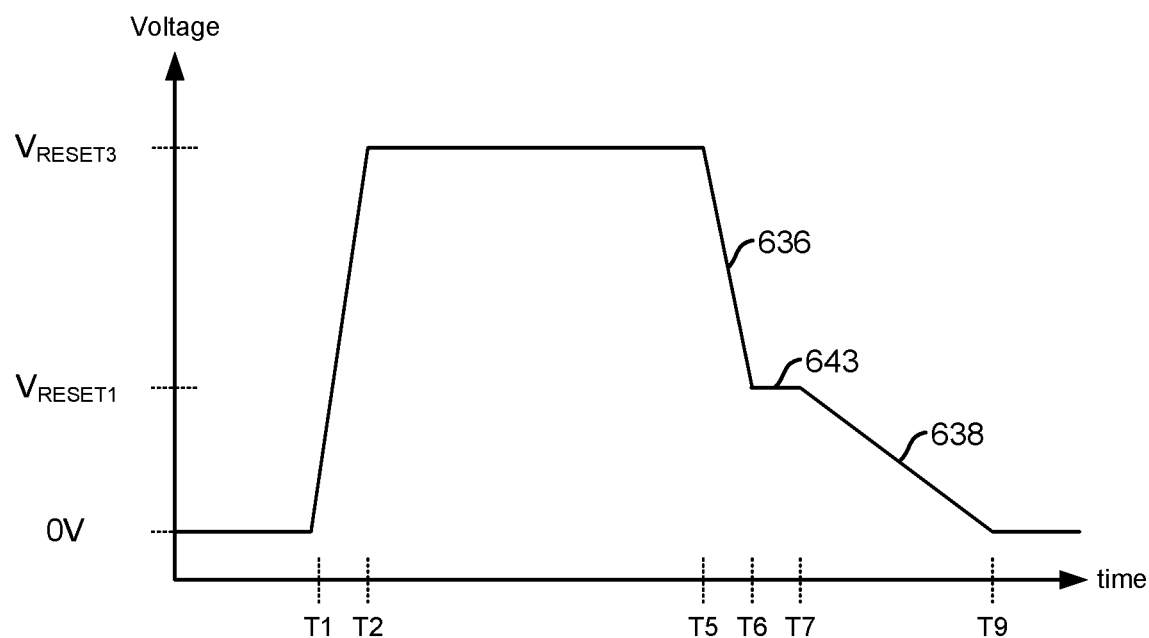

FIG. 6G depicts one embodiment of a two-step RESET pulse in which a first portion of a two-step RESET pulse ramps down from a third voltage level VRESET3 at time T5 to a first voltage level VRESET1 that is greater than the voltage level VRESET0 in FIG. 6F at time T6. The second portion of the two-step RESET pulse remains at VRESET1 between times T6 and T7. The first slope 636 corresponding with the falling edge of the two-step RESET pulse between times T5 and T6 is steeper than the second slope 638 between times T7 and T8. In some embodiments, the setting of the voltage level to which the maximum voltage level of the two-step RESET pulse ramps down to (e.g., to either VRESET1 or VRESET0) may depend on a chip temperature. For example, if the chip temperature is greater than a threshold temperature, then the intermediate voltage level may be increased from VRESET0 in FIG. 6F to VRESET1 in FIG. 6G. The pulse width 643 for the second portion of the two-step RESET pulse between times T6 and T7 may also be adjusted over time based on chip temperature. For example, if the chip temperature is greater than a threshold temperature (e.g., is greater than 55 degrees Celsius), then the pulse width for the second portion of the two-step RESET pulse may be increased or made greater than the time difference between times T6 and T7.

In some embodiments, the determination of whether to apply a single RESET pulse or a two-step RESET pulse may depend upon the chip temperature. In one example, if the chip temperature is greater than a threshold temperature, then a two-step RESET pulse may be applied; otherwise, if the chip temperature is not greater than the threshold temperature, then a single RESET pulse (e.g., similar to the RESET pulse depicted in FIG. 6E) may be applied. In another example, if a temperature sensor (e.g., a silicon bandgap-based temperature sensor) arranged on a semiconductor memory die detects that the chip temperature has exceeded the threshold temperature, then write circuitry, such as write circuit 560 in FIG. 5, may generate a two-step RESET pulse. The two-step RESET pulse generated by the write circuitry may correspond with the two-step RESET pulse depicted in FIG. 6F or the two-step RESET pulse depicted in FIG. 6G.

Figure 6H:
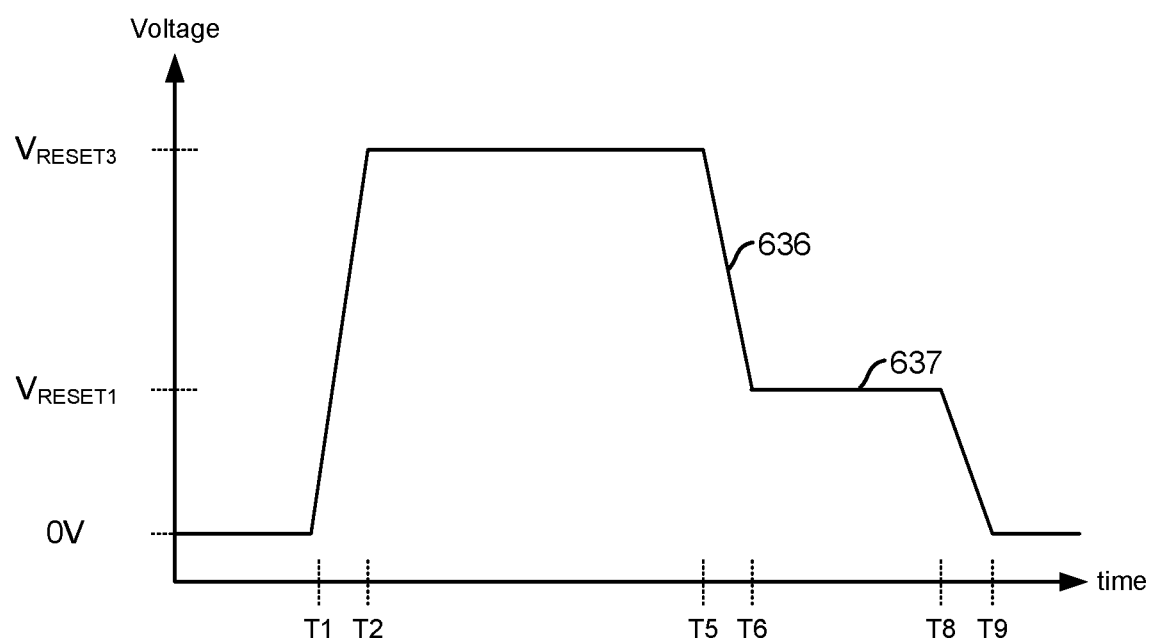

FIG. 6H depicts one embodiment of a two-step RESET pulse in which a first portion of a two-step RESET pulse ramps down from a third voltage level VRESET3 at time T5 to a first voltage level VRESET1 that is greater than the voltage level VRESET0 in FIG. 6F at time T6. The second portion of the two-step RESET pulse remains at VRESET1 between times T6 and T8. The first slope 636 corresponds with the falling edge of the two-step RESET pulse between times T5 and T6. In some embodiments, the setting of the voltage level to which the maximum voltage level of the two-step RESET pulse ramps down to (e.g., to either VRESET1 or VRESET0) may depend on a number of data write errors that have occurred to a phase change memory cell. For example, if the number of data write errors is greater than a threshold number of errors, then the intermediate voltage level may be increased from VRESET0 in FIG. 6F to VRESET1 in FIG. 6H. The pulse width 637 for the second portion of the two-step RESET pulse between times T6 and T8 may also be adjusted over time based on chip temperature and/or the number of data write errors that have occurred to a phase change memory cell. For example, if the chip temperature is greater than a threshold temperature (e.g., is greater than 75 degrees Celsius) or the number of data write errors is greater than a threshold number of errors (e.g., is greater than one data write error), then the pulse width for the second portion of the two-step RESET pulse may be increased from the pulse width 643 depicted in FIG. 6G to the pulse width 637 depicted in FIG. 6H that is longer in duration than the pulse width 643 depicted in FIG. 6G.

In some embodiments, the two-step RESET pulse depicted in FIG. 6G may be applied to a first phase change memory cell connected to a first bit line and the two-step RESET pulse depicted in FIG. 6H may be applied to a second phase change memory cell connected to a second bit line during a SET operation; both the first phase change memory cell and the second phase change memory cell may be connected to a common word line. It is understood that the voltage pulses in FIGS. 6A-6H are exemplary and do not show more complex circuit behavior that can occur such as transient voltage spikes caused by threshold switching, leakage, and other non-linear voltage dependence of conductivity in array components.

Figure 7A:
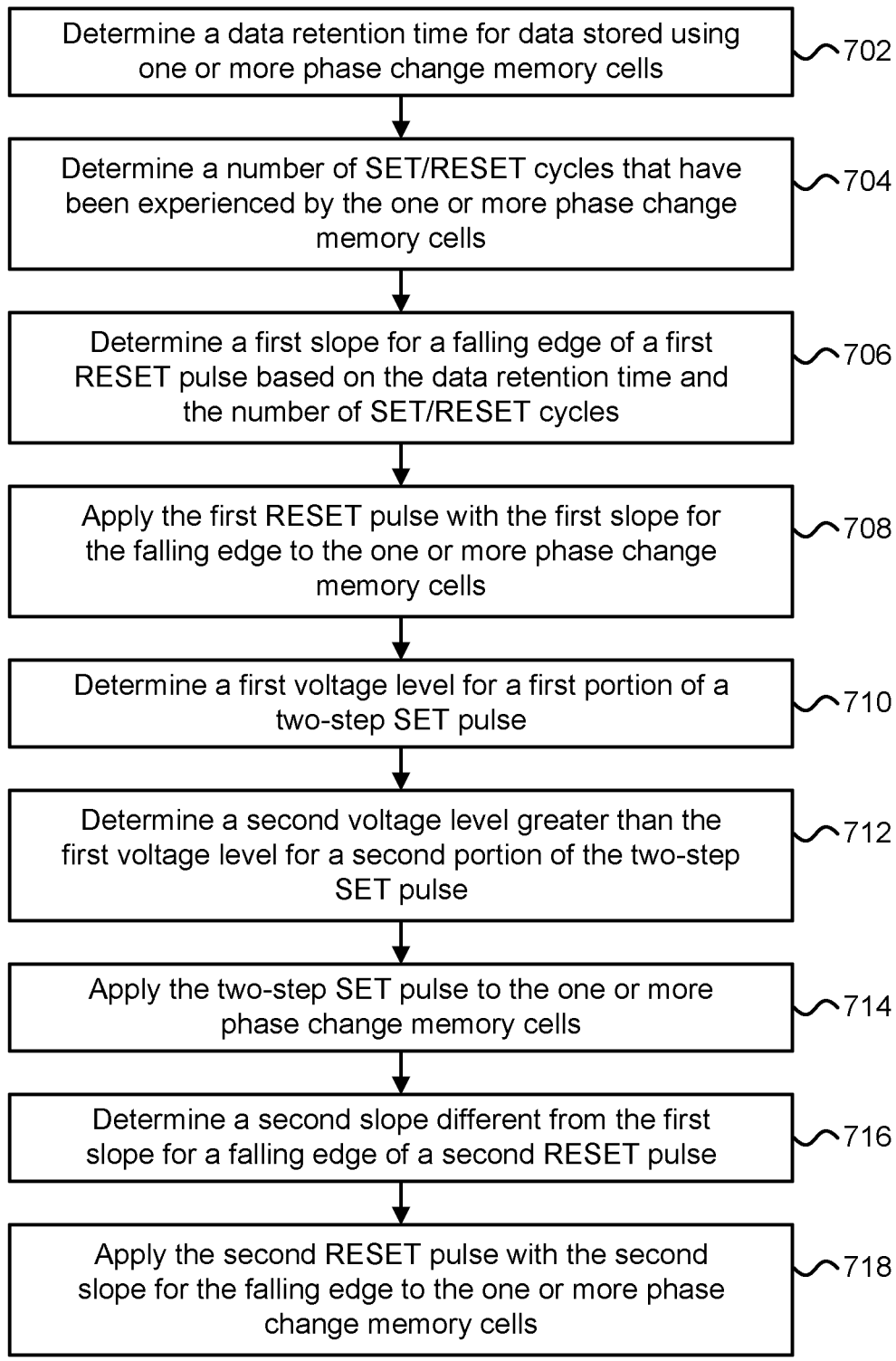
FIG. 7A is a flowchart describing one embodiment of a process for RESETTING and SETTING a phase change material of a phase change memory cell.

FIG. 7A is a flowchart describing one embodiment of a process for RESETTING and SETTING a phase change material of a phase change memory cell. In one embodiment, the process of FIG. 7A may be performed by a memory chip controller, such as the memory chip controller 105 depicted in FIG. 1A, or be performed by one or more control circuits arranged on a memory chip, such as memory chip 102 in FIG. 1A.

In step 702, a data retention time for data stored using one or more phase change memory cells is determined. In some cases, the data retention time may correspond with the amount of time between a RESET operation for resetting one or more phase change memory cells into a high resistance state and a subsequent SET operation for setting the one or more phase change memory cells into a low resistance state. In other cases, the data retention time may correspond with the amount of time between a SET operation for writing the data stored using the one or more phase change memory cells and a subsequent RESET operation to erase the data stored using the one or more phase change memory cells. In one example, the data retention time for data stored using the one or more phase change memory cells may be acquired from a table stored in non-volatile memory or stored as configuration information stored within a non-volatile memory that is in communication with one or more control circuits. The one or more control circuits may include combination logic, state machines, page registers, SRAM, and control circuitry for controlling the operation of a memory chip including performing SET and RESET operations on the one or more phase change memory cells.

In step 704, a number of SET/RESET cycles that have been experienced by the one or more phase change memory cells is determined. The number of SET/RESET cycles may correspond with the number of SET operations followed by subsequent RESET operations that have been applied to the one or more phase change memory cells. The number of SET/RESET cycles may be stored on a per page basis with the number of SET/RESET cycles incremented each time a RESET operation is performed on phase change memory cells for a particular page subsequent to a prior SET operation performed on the phase change memory cells for the particular page. The particular page may correspond with a word line within a memory array and the phase change memory cells for the particular page may be directly connected to the word line.

In step 706, a first slope for a falling edge of a first RESET pulse is determined based on the data retention time and the number of SET/RESET cycles. In one example, if the data retention time is less than a threshold amount of time (e.g., less than 24 hours), then the first slope may correspond with slope 641 in FIG. 6E; otherwise, if the data retention time is greater than or equal to the threshold amount of time, then the first slope may correspond with slope 640 in FIG. 6E. In another example, if the data retention time is less than the threshold amount of time and the number of SET/RESET cycles that have been experienced by phase change memory cells is less than a threshold number of cycles (e.g., is less than ten SET/RESET cycles), then the first slope of the falling edge of a two-step RESET pulse may be steep with a fast falling edge and correspond with slope 641 in FIG. 6E, compared with a slower falling edge that corresponds with slope 640 in FIG. 6E. The slope 641 in FIG. 6E may comprise a change in voltage of 2V (e.g., VRESET2 is set to 2V) over 20 ns while the slope 640 in FIG. 6E may comprise a change in voltage of 2V over 60 ns. In step 708, the first RESET pulse with the first slope for the falling edge is applied to the one or more phase change memory cells in order to perform a RESET operation that places the one or more phase change memory cells into an amorphous high resistance state.

In step 710, a first voltage level for a first portion of a two-step SET pulse is determined. In step 712, a second voltage level greater than the first voltage level for a second portion of the two-step SET pulse is determined. The first voltage level for the first portion of the two-step SET pulse and the second voltage level for the second portion of the two-step SET pulse may be acquired from a lookup table stored in non-volatile memory and may vary depending on a chip temperature. In step 714, the two-step SET pulse is applied to the one or more phase change memory cells in order to perform a SET operation that places the one or more phase change memory cells into a crystalline low resistance state. In one example, the two-step SET pulse may correspond with the two-step SET pulse depicted in FIG. 6C.

In step 716, a second slope different from the first slope is determined for a falling edge of a second RESET pulse. In step 718, the second RESET pulse with the second slope for the falling edge is applied to the one or more phase change memory cells. Thus, the slopes of the falling edges of RESET pulses that are applied to the one or more phase change memory cells may be adjusted over time. In one embodiment, if a data retention time is increased, then a less steep slope for the falling edge of a RESET pulse may be applied, for example, by applying the slope 640 in FIG. 6E that may comprise a change in voltage from VRESET2 to 0V over 60 ns instead of applying the slope 641 in FIG. 6E that may comprise a change in voltage from VRESET2 to 0V over 20 ns. In another embodiment, if a write error or a programming error occurs during a SET operation for a phase change memory cell, then subsequent RESET operations for the phase change memory cell may use steeper slopes for the falling edge of the RESET pulses applied to the phase change memory cell. In some cases, if a write error or a programming error occurs during a SET operation for a phase change memory cell, then the slope of the falling edge of a subsequent RESET pulse may be increased by decreasing the time period for the falling edge of the RESET pulse. In one example, upon detection that a phase change memory cell has experienced a write error during a prior SET operation, the next RESET operation for the phase change memory cell may apply a RESET pulse with a failing edge that occurs over 20 ns instead of over 60 ns that would be used in the event that the phase change memory cell did not experience the write error during the prior SET operation.

Figure 7B:
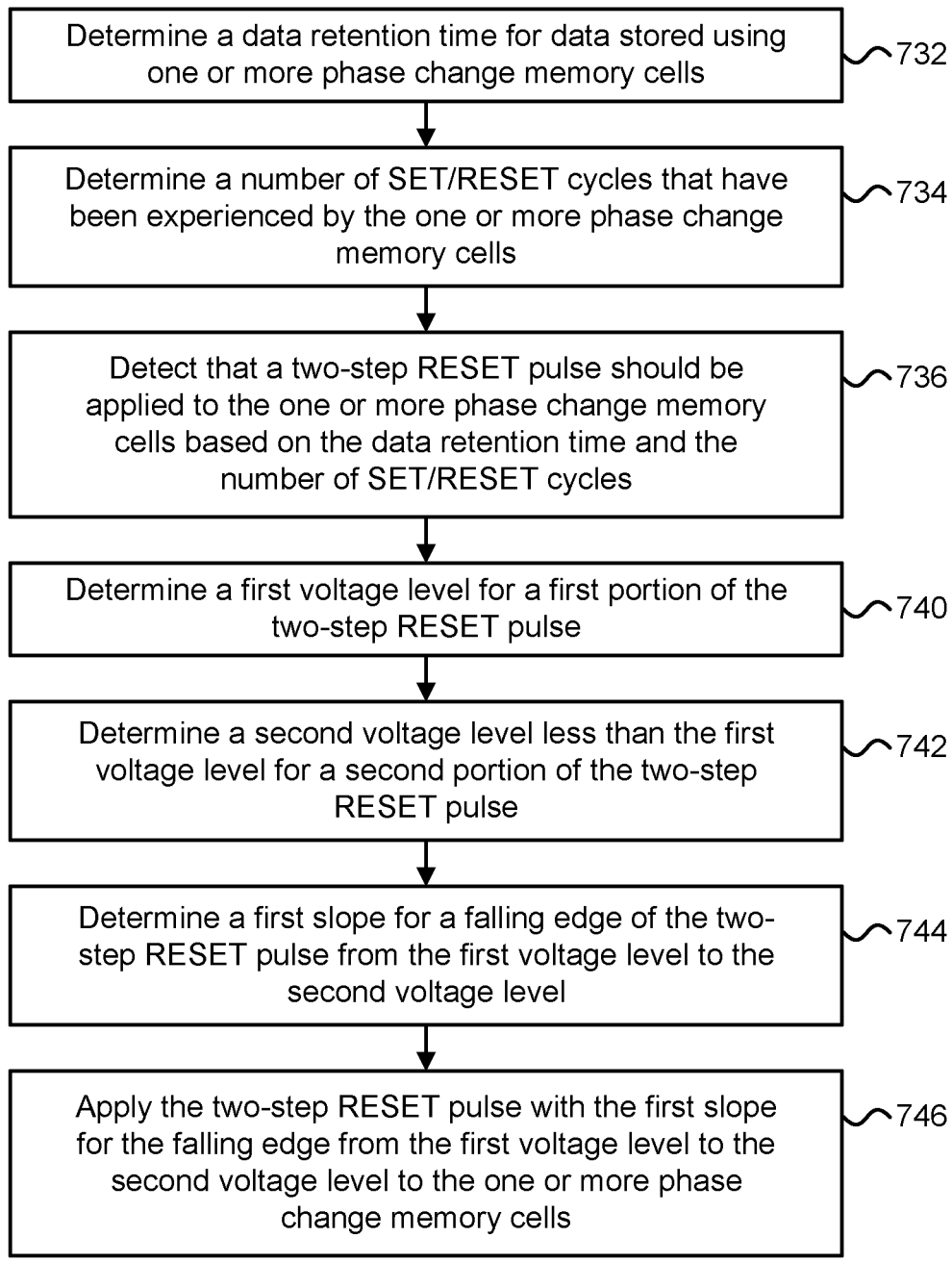
FIG. 7B is a flowchart describing one embodiment of a process for RESETTING a phase change material of a phase change memory cell.

FIG. 7B is a flowchart describing one embodiment of a process for RESETTING a phase change material of a phase change memory cell. In one embodiment, the process of FIG. 7B may be performed by a memory chip controller, such as the memory chip controller 105 depicted in FIG. 1A. In another embodiment, the process of FIG. 7B may be performed by one or more control circuits arranged on a memory chip, such as memory core control circuits 104 on memory chip 102 in FIG. 1A.

In step 732, a data retention time for storing data using one or more phase change memory cells is determined. In step 734, a number of SET/RESET cycles that have been experienced by the one or more phase change memory cells is determined. The number of SET/RESET cycles may be associated with the number of program/erase cycles that have been experienced by the one or more phase change memory cells since fabrication of the integrated circuit that includes the one or more phase change memory cells. The data retention time may correspond with the amount of time between a SET operation for writing data stored using the one or more phase change memory cells until the next SET or RESET operation to be performed on the one or more phase change memory cells. The data retention time may be acquired from a lookup table stored in non-volatile memory or a configuration memory array. The configuration memory array may comprise a one-time programmable non-volatile memory array or a re-writable non-volatile memory array. In some cases, the number of SET/RESET cycles may be stored on a per page basis with the number of SET/RESET cycles stored within an overhead region of a page of data.

In step 736, it is detected that a two-step RESET pulse should be applied to the one or more phase change memory cells based on the data retention time and the number of SET/RESET cycles. In one embodiment, the two-step RESET pulse should be applied to the one or more phase change memory cells if either the data retention time is greater than a threshold amount of time (e.g., greater than an hour) or the number of SET/RESET cycles has exceeded a threshold number of cycles (e.g., is greater than ten). In step 740, a first voltage level for a first portion of the two-step RESET pulse is determined. In step 742, a second voltage level less than the first voltage level for a second portion of the two-step RESET pulse is determined. In step 744, a first slope for a falling edge of the two-step RESET pulse from the first voltage level to the second voltage level is determined. In step 746, the two-step RESET pulse with the first slope for the falling edge from the first voltage level to the second voltage level is applied to the one or more phase change memory cells. The two-step RESET pulse with the first slope for the falling edge may be applied using a write circuit, such as write circuit 560 in FIG. 5. The two-step RESET pulse may be applied to bit lines connected to the one or more phase change memory cells.

In one embodiment, the first voltage level for the first portion of the two-step RESET pulse and the second voltage level for the second portion of the two-step RESET pulse may be acquired from a lookup table stored in non-volatile memory. In one example, the first voltage level for the first portion of the two-step RESET pulse may correspond with VRESET3 in FIG. 6G and the second voltage level for the second portion of the two-step RESET pulse may correspond with VRESET1 in FIG. 6G. In another example, the first voltage level for the first portion of the two-step RESET pulse may correspond with VRESET2 in FIG. 6H and the second voltage level for the second portion of the two-step RESET pulse may correspond with VRESET1 in FIG. 6H. The determination of whether to apply the RESET voltage levels depicted in FIG. 6G or the RESET voltage levels depicted in FIG. 6H may depend on a chip temperature and/or the number of SET/RESET cycles that have occurred to the one or more phase change memory cells. If the number of SET/RESET cycles that have occurred to the one or more phase change memory cells is greater than a threshold number of SET/RESET cycles (e.g., is greater than ten), then the RESET voltage levels depicted in FIG. 6H may be applied to the one or more phase change memory cells during the next RESET operation.

Figure 7C:
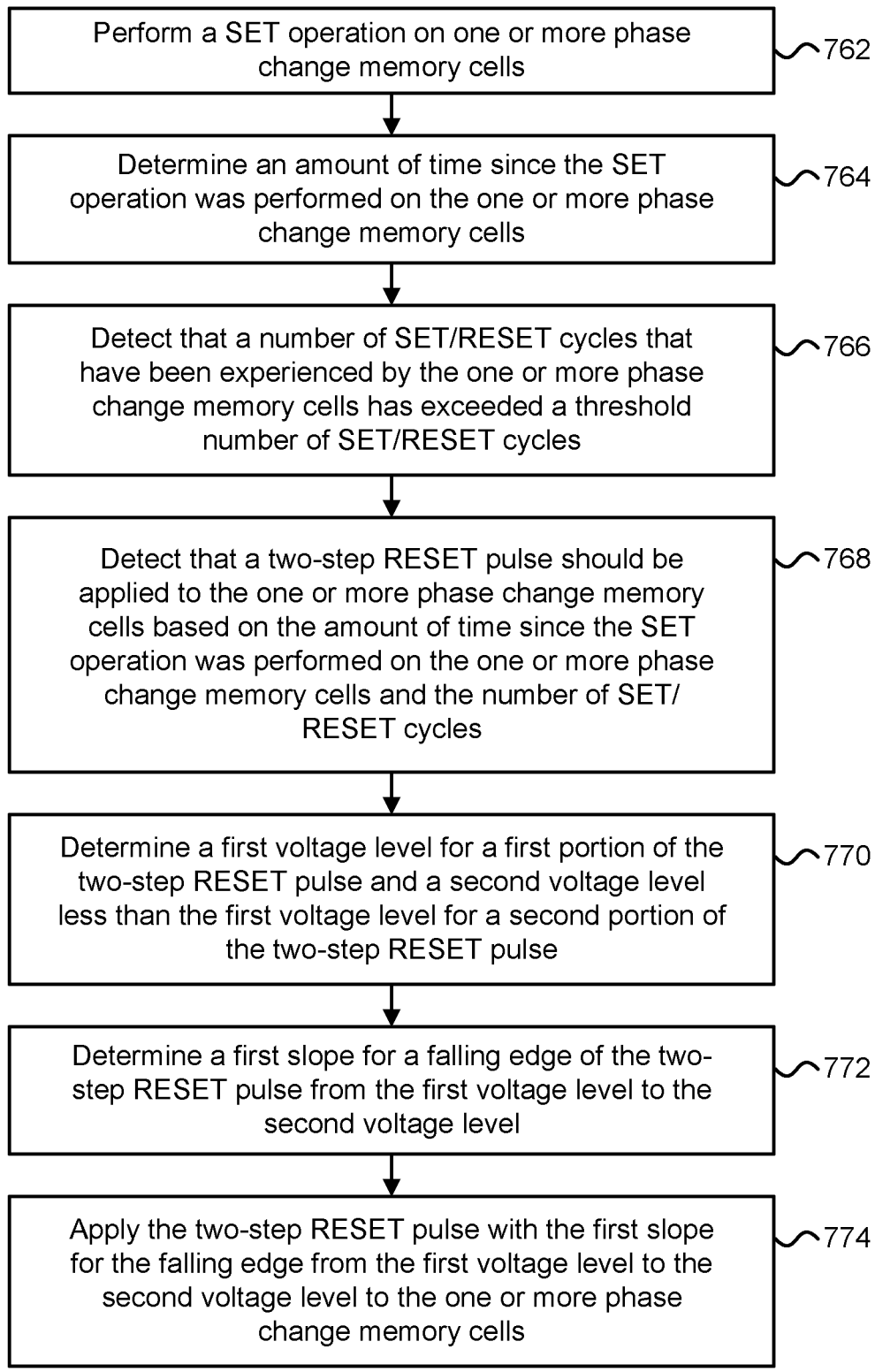
FIG. 7C is a flowchart describing another embodiment of a process for RESETTING a phase change material of a phase change memory cell.

FIG. 7C is a flowchart describing another embodiment of a process for RESETTING a phase change material of a phase change memory cell. The phase change material may comprise a chalcogenide-based memory material such as a germanium-antimony-tellurium compound (GST), a chalcogenide glass, or a chalcogenide alloy employing elements Ge, Sb, Te, As, Se, In, Si, C, O, and/or N. In one embodiment, the process of FIG. 7C may be performed by a memory chip controller, such as the memory chip controller 105 depicted in FIG. 1A. In another embodiment, the process of FIG. 7C may be performed by one or more control circuits arranged on a memory chip, such as memory core control circuits 104 on memory chip 102 in FIG. 1A.

In step 762, a SET operation is performed on one or more phase change memory cells. The one or more phase change memory cells may be connected to a common word line within a phase change memory array. The SET operation may include application of a two-step SET pulse, such as the two-step SET pulse depicted in FIG. 6C, to the one or more phase change memory cells. In step 764, an amount of time since the SET operation of step 762 was performed on the one or more phase change memory cells is determined. The amount of time since the last SET operation was performed on the one or more phase change memory cells may be determined by storing a time stamp identifying when the last SET operation was performed and calculating the amount of time that has elapsed since the last SET operation using the time stamp. In some cases, the amount of time since the last SET operation was performed on the one or more phase change memory cells may be used to determine an average data retention time for data stored within the one or more phase change memory cells. In one example, the amount of time between SET operations and subsequent RESET operations for the past ten SET/RESET cycles may be average to compute the average data retention time. In cases where the one or more phase change memory cells are more frequently written to and/or erased, then constraints on the data retention time may be relaxed.

In step 766, it is detected that a number of SET/RESET cycles that have been experienced by the one or more phase change memory cells has exceeded a threshold number of SET/RESET cycles. In one example, it may be detected that the number of SET/RESET cycles experienced by the one or more phase change memory cells has exceeded ten total SET/RESET cycles. In step 768, it is detected that a two-step RESET pulse should be applied to the one or more phase change memory cells based on the amount of time since the SET operation was performed on the one or more phase change memory cells and the number of SET/RESET cycles. In one embodiment, it may be detected that the two-step RESET pulse should be applied to the one or more phase change memory cells if the amount of time since the SET operation of step 762 was performed has exceeded a threshold amount of time (e.g., more than 24 hours). In another embodiment, it may be detected that the two-step RESET pulse should be applied to the one or more phase change memory cells if the amount of time since the SET operation was performed has exceeded a threshold amount of time and the number of SET/RESET cycles has exceeded a threshold number of cycles (e.g., is greater than ten SET/RESET cycles).

In step 770, a first voltage level for a first portion of the two-step RESET pulse and a second voltage level less than the first voltage level for a second portion of the two-step RESET pulse are determined. The first voltage level for the first portion of the two-step RESET pulse and the second voltage level for the second portion of the two-step RESET pulse may be determined by accessing a lookup table stored in non-volatile memory. In one example, the first voltage level may correspond with VRESET3 in FIG. 6H and the second voltage level may correspond with VRESET1 in FIG. 6H. In step 772, a first slope for a falling edge of the two-step RESET pulse from the first voltage level to the second voltage level is determined. The steepness of the first slope may be determined by accessing a lookup table stored in non-volatile memory. The first slope for the falling edge of the two-step RESET pulse may correspond with slope 636 in FIG. 6H. The first slope may be a function of the difference between the first voltage level and the second voltage level and may be set based on the number of SET/RESET cycles for the one or more phase change memory cells.

The pulse width corresponding with the second voltage level for the second portion of the two-step RESET pulse may be determined by accessing a lookup table stored in non-volatile memory. The pulse width may be set based on the number of SET/RESET cycles for the one or more phase change memory cells and/or a chip temperature. In one example, the pulse width may correspond with the pulse width 637 depicted in FIG. 6H. Therefore, both the pulse width corresponding with the second voltage level for the second portion of the two-step RESET pulse and the first voltage level (e.g., the maximum voltage level for the two-step RESET pulse) may be set and adjusted over time based on chip temperature and/or the number of SET/RESET cycles for the one or more phase change memory cells.

In step 774, the two-step RESET pulse with the first slope for the falling edge from the first voltage level to the second voltage level is applied to the one or more phase change memory cells. The two-step RESET pulse may be applied to the one or more phase change memory cells by a write circuit coupled to the one or more phase change memory cells (e.g., via a column decoder, such as column decoder 504 in FIG. 5). The write circuit may include one or more voltage waveform generators and control circuitry for generating the two-step RESET pulse. The write circuit may be in communication with a non-volatile memory that stores configuration information such as the threshold data retention time and the threshold number of SET/RESET cycles. The one or more phase change memory cells may comprise a plurality of phase change memory cells that are connected to a common word line within a phase change memory array. The phase change memory array may comprise a three-dimensional memory array.

One embodiment of the disclosed technology includes one or more phase change memory cells and one or more control circuits. The one or more control circuits configured to determine a data retention time for data stored using the one or more phase change memory cells and determine a first slope for a falling edge of a first RESET pulse based on the data retention time. The one or more control circuits configured to apply the first RESET pulse with the first slope for the falling edge of the first RESET pulse to the one or more phase change memory cells. In some embodiments, the one or more control circuits may be configured to determine a number of SET/RESET cycles that have been applied to the one or more phase change memory cells and determine the first slope for the falling edge of the first RESET pulse based on the data retention time and the number of SET/RESET cycles that have been applied to the one or more phase change memory cells. Moreover, the one or more control circuits may be configured to determine a second slope different from the first slope for a falling edge of a second RESET pulse and apply the second RESET pulse with the second slope for the falling edge to the one or more phase change memory cells subsequent to application of the first RESET pulse to the one or more phase change memory cells.

One embodiment of the disclosed technology includes a memory array including one or more phase change memory cells and one or more control circuits. The one or more control circuits configured to determine a number of SET/RESET cycles that have been applied to the one or more phase change memory cells and determine a first slope for a falling edge of a first RESET pulse based on the number of SET/RESET cycles that have been applied to the one or more phase change memory cells. The one or more control circuits configured to apply the first RESET pulse with the first slope for the falling edge of the first RESET pulse to the one or more phase change memory cells.

One embodiment of the disclosed technology includes determining a data retention time for data stored using one or more phase change memory cells, determining a number of SET/RESET cycles that have been applied to the one or more phase change memory cells, determining a first slope for a falling edge of a first RESET pulse based on the data retention time and the number of SET/RESET cycles that have been applied to the one or more phase change memory cells, and applying the first RESET pulse with the first slope for the falling edge of the first RESET pulse to the one or more phase change memory cells. In some embodiments, the disclosed technology may further include determining a first voltage level for a first portion of a two-step SET pulse, determining a second voltage level greater than the first voltage level for a second portion of the two-step SET pulse, and applying the two-step SET pulse to the one or more phase change memory cells subsequent to applying the first RESET pulse to the one or more phase change memory cells. Moreover, the disclosed technology may include detecting that a two-step RESET pulse should be applied to the one or more phase change memory cells based on a chip temperature and applying the two-step RESET pulse to the one or more phase change memory cells subsequent to applying the two-step SET pulse to the one or more phase change memory cells.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
one or more phase change memory cells; and
one or more control circuits in communication with the one or more phase change memory cells, the one or more control circuits are configured to determine a number of SET/RESET cycles that have been applied to the one or more phase change memory cells and determine whether a single RESET pulse or a two-step RESET pulse should be applied to the one or more phase change memory cells based on the number of SET/RESET cycles that have been applied to the one or more phase change memory cells, the one or more control circuits are configured to determine a first slope for a falling edge of the two-step RESET pulse based on the number of SET/RESET cycles that have been applied to the one or more phase change memory cells and apply the two-step RESET pulse to the one or more phase change memory cells in response to detection that the number of SET/RESET cycles that have been applied to the one or more phase change memory cells is greater than a threshold number of cycles.

2. The apparatus of claim 1, wherein:
the one or more control circuits are configured to determine a first voltage level for a first portion of a two-step SET pulse and determine a second voltage level greater than the first voltage level for a second portion of the two-step SET pulse, the one or more control circuits are configured to apply the two-step SET pulse to the one or more phase change memory cells subsequent to application of the two-step RESET pulse to the one or more phase change memory cells.

3. The apparatus of claim 2, wherein:
the one or more control circuits are configured to determine a second slope different from the first slope for a second falling edge of the two-step RESET pulse and apply the the two-step RESET pulse with the first slope for the falling edge and the second slope for the second falling edge to the one or more phase change memory cells.

4. The apparatus of claim 2, wherein:
the one or more control circuits are configured to detect that the two-step RESET pulse should be applied to the one or more phase change memory cells based on the number of SET/RESET cycles that were applied to the one or more phase change memory cells and an amount of time since the two-step SET pulse was applied to the one or more phase change memory cells.

5. The apparatus of claim 4, wherein:
the one or more control circuits are configured to determine a maximum voltage level for a first portion of the two-step RESET pulse and determine a second voltage level less than the maximum voltage level for a second portion of the two-step RESET pulse.

6. The apparatus of claim 5, wherein:
the one or more control circuits are configured to determine a chip temperature and determine the second voltage level based on the chip temperature.

7. The apparatus of claim 5, wherein:
the one or more control circuits are configured to determine a chip temperature and determine a time duration for the second portion of the two-step RESET pulse based on the chip temperature.

8. The apparatus of claim 1, wherein:
the one or more phase change memory cells include a chalcogenide-based memory material.

9. The apparatus of claim 1, wherein:
the one or more phase change memory cells are part of a three-dimensional memory array.

10. An apparatus, comprising:
a memory array including one or more phase change memory cells; and one or more control circuits coupled to the memory array, the one or more control circuits are configured to determine a number of SET/RESET cycles that have been applied to the one or more phase change memory cells and determine whether a single RESET pulse or a two-step RESET pulse should be applied to the one or more phase change memory cells based on the number of SET/RESET cycles that have been applied to the one or more phase change memory cells, the one or more control circuits are configured to determine a first slope for a falling edge of the two-step RESET pulse based on the number of SET/RESET cycles that have been applied to the one or more phase change memory cells, the one or more control circuits are configured to apply the two-step RESET pulse with the first slope for the falling edge of the two-step RESET pulse to the one or more phase change memory cells.

11. The apparatus of claim 10, wherein:
the application of the two-step RESET pulse with the first slope for the falling edge of the two-step RESET pulse to the one or more phase change memory cells causes a resistance of the one or more phase change memory cells to increase.

12. The apparatus of claim 10, wherein:
the one or more control circuits are configured to determine a data retention time for data stored using the one or more phase change memory cells and determine the first slope for the falling edge of the two-step RESET pulse based on the data retention time and the number of SET/RESET cycles that have been applied to the one or more phase change memory cells.

13. The apparatus of claim 10, wherein:
the one or more control circuits are configured to determine a first voltage level for a first portion of a two-step SET pulse and determine a second voltage level different from the first voltage level for a second portion of the two-step SET pulse, the one or more control circuits are configured to apply the two-step SET pulse to the one or more phase change memory cells subsequent to application of the two-step RESET pulse to the one or more phase change memory cells.

14. The apparatus of claim 10, wherein:
the one or more control circuits are configured to determine a second slope different from the first slope for a second falling edge of the two-step RESET pulse and apply the the two-step RESET pulse with the first slope for the falling edge and the second slope for the second falling edge to the one or more phase change memory cells.

15. The apparatus of claim 10, wherein:
the one or more phase change memory cells include a chalcogenide-based memory material.

16. A method, comprising:
determining a number of SET/RESET cycles that have been applied to one or more phase change memory cells;
determining whether a single RESET pulse or a two-step RESET pulse should be applied to the one or more phase change memory cells based on the number of SET/RESET cycles that have been applied to the one or more phase change memory cells;
determining a first slope for a falling edge of the two-step RESET pulse based on the number of SET/RESET cycles that have been applied to the one or more phase change memory cells; and
applying the two-step RESET pulse with the first slope for the falling edge of the two-step RESET pulse to the one or more phase change memory cells.

17. The method of claim 16, wherein:
determining a first voltage level for a first portion of a two-step SET pulse;
determining a second voltage level greater than the first voltage level for a second portion of the two-step SET pulse; and
applying the two-step SET pulse to the one or more phase change memory cells subsequent to applying the two-step RESET pulse to the one or more phase change memory cells.

18. The method of claim 17, wherein:
detecting that the number of SET/RESET cycles that have been applied to the one or more phase change memory cells is greater than a threshold number of cycles; and
applying the two-step RESET pulse to the one or more phase change memory cells in response to detecting that the number of SET/RESET cycles that have been applied to the one or more phase change memory cells is greater than the threshold number of cycles.

19. The method of claim 18, wherein:
the one or more phase change memory cells include a chalcogenide-based memory material.

* * * * *